(12) United States Patent
Jung et al.

(10) Patent No.: US 12,184,106 B2
(45) Date of Patent: Dec. 31, 2024

(54) SYSTEM AND METHODS FOR RECHARGEABLE BATTERY DIAGNOSTICS

(71) Applicant: Purdue Research Foundation, West Lafayette, IN (US)

(72) Inventors: Byunghoo Jung, West Lafayette, IN (US); Chiwook Park, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 637 days.

(21) Appl. No.: 17/382,279

(22) Filed: Jul. 21, 2021

(65) Prior Publication Data
US 2022/0190614 A1 Jun. 16, 2022

Related U.S. Application Data

(60) Provisional application No. 63/054,567, filed on Jul. 21, 2020.

(51) Int. Cl.
*H02J 7/00* (2006.01)
*G01R 31/392* (2019.01)
(Continued)

(52) U.S. Cl.
CPC .......... *H02J 7/0049* (2020.01); *G01R 31/392* (2019.01); *H01M 10/484* (2013.01); *H02J 7/005* (2020.01); *H02J 50/10* (2016.02)

(58) Field of Classification Search
None
See application file for complete search history.

(56) References Cited

U.S. PATENT DOCUMENTS 5,093,624 A * 3/1992 Stevenson .............. G01R 31/36
324/426
5,132,626 A * 7/1992 Limuti .................. H01M 10/48
73/304 C
(Continued)

OTHER PUBLICATIONS

Battery Management System Tutorial, www.renesas.com/US/en/products/power-power-management/battery-management-system-tutorial, pp. 1-9, 2018.
(Continued)

*Primary Examiner* — Jas A Sanghera
(74) *Attorney, Agent, or Firm* — Purdue Research Foundation

(57) ABSTRACT

Disclosed is a system and methods for measuring electrochemical state of rechargeable batteries such as state of charge (SoC) and state of health (SoH). In various aspects, the system may include an inductive coil attached to the battery and a battery current sensor. Alternating current with a fixed frequency is applied to the coil to generate magnetic fields, and the magnetic fields induce losses including Eddy current loss and a loss related to battery currents. The system compensates for the effect of the loss related to battery currents for battery electrochemical state estimation. In another aspect, the system uses both coil-based measurement and ampere hour counting (AHC) measurement for SoC measurement. The system conducts coil-based SoC measurement only occasionally to reset the accumulated error of AHC-based SoC measurement. In yet another aspect, the system combines coil-based measurement with other measurements.

23 Claims, 21 Drawing Sheets

(51) Int. Cl.
*H01M 10/48* (2006.01)
*H02J 50/10* (2016.01)

(56) References Cited

U.S. PATENT DOCUMENTS

| | | | |
|---|---|---|---|
| 5,250,903 | A | 10/1993 | Limuti et al. |
| 5,537,042 | A * | 7/1996 | Beutler ................ G01R 31/396 |
| | | | 429/10 |
| 9,851,408 | B2 | 12/2017 | Tinnemeyer |
| 2009/0013521 | A1* | 1/2009 | Okumura ............ H01M 10/482 |
| | | | 29/730 |
| 2013/0154652 | A1* | 6/2013 | Rice ...................... H01M 10/48 |
| | | | 324/426 |
| 2021/0396817 | A1* | 12/2021 | Dandl .................. H02J 7/0014 |

OTHER PUBLICATIONS

Hauser, A. et al., High-voltage battery management systems (BMS) for electric vehicles, Advances in Battery Technologies for Electric Vehicles, Woodhead Publishing, 11, pp. 265-282, 2015.

Li, Y. et al., A combination Kalman filter approach for State of Charge estimation of lithium-ion battery considering model uncertainty, Energy, 109, pp. 933-946, 2016.

Ouyang, M. et al., Determination of the battery pack capacity considering the estimation error using a Capacity-Quantity diagram, Applied Energy, 177, pp. 384-392, 2016.

* cited by examiner

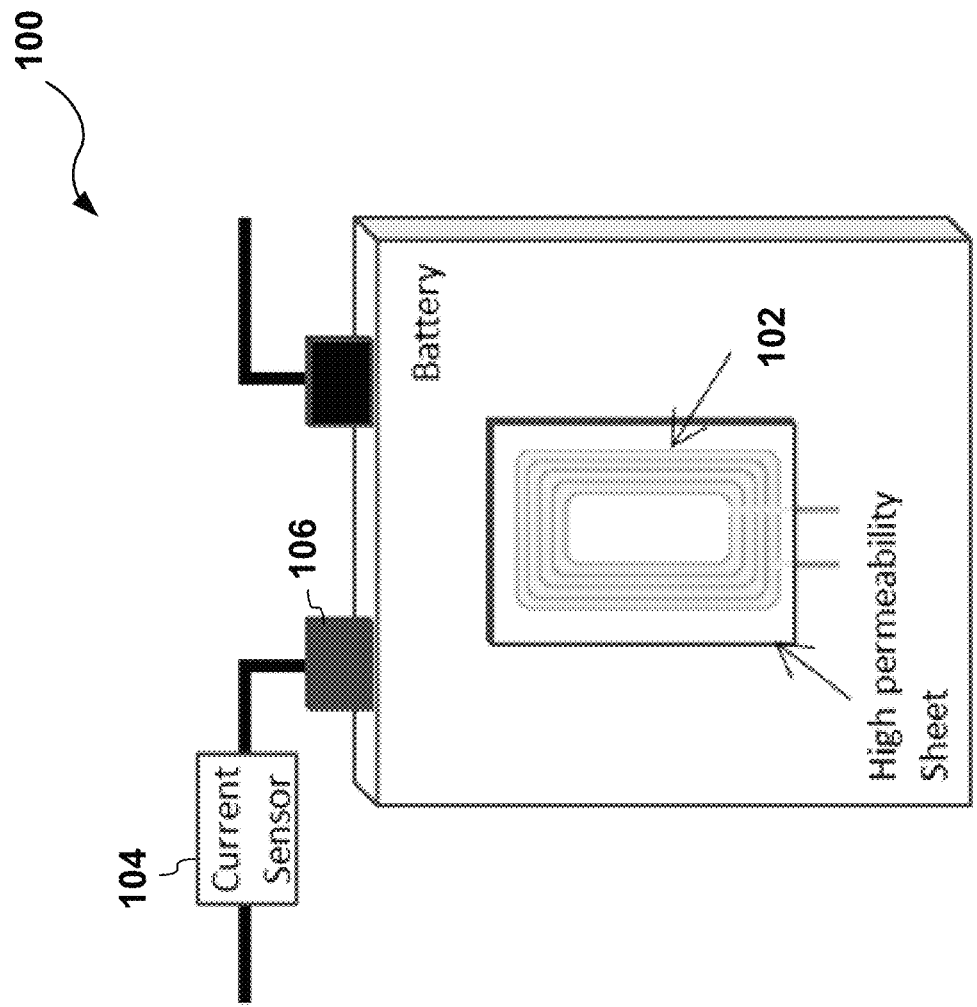
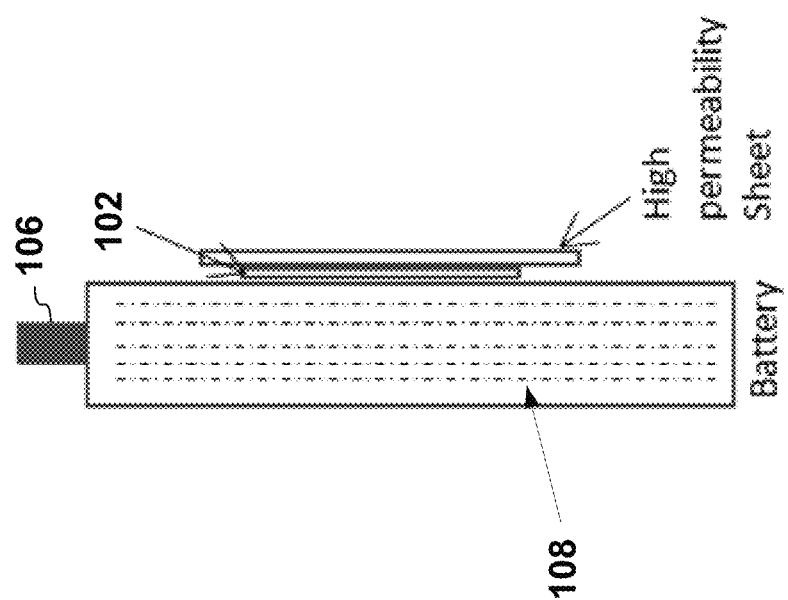
FIG. 1B
FIG. 1A

SYSTEM AND METHODS FOR RECHARGEABLE BATTERY DIAGNOSTICS

CROSS REFERENCE TO RELATED APPLICATIONS

This application claims the benefit of U.S. Provisional Application No. 63/054,567 filed Jul. 21, 2020, which is incorporated by reference in its entirety.

TECHNICAL FIELD

This disclosure relates to rechargeable batteries and, in particular, to diagnostics and monitoring of rechargeable batteries.

BACKGROUND

Battery management system (BMS) may provide, among other operations, cell balancing, thermal management, and electrochemical state estimation. The electrochemical state may include, for example, state of charge and state of health of a battery. The BMS, or other systems in communications with the BMS, may rely on electrochemical state estimations to perform various operations. Accurately measuring the electrochemical state of rechargeable batteries is important for, among other reasons, prolonging lifetime, maintaining performance, and preventing malfunctions or system failures of many electrical systems that rely on batteries such as electric vehicles (EV) and energy storage systems (ESS).

SUMMARY

Disclosed is a system and methods for measuring electrochemical state of rechargeable batteries such as state of charge (SoC) and state of health (SoH). In various aspects, the system may include a planar inductive coil attached to the battery and a battery current sensor. Alternating current with a fixed frequency is applied to the coil to generate magnetic fields, and the magnetic fields induce losses including Eddy current loss and a loss related to battery currents. The system compensates for the effect of the loss related to battery currents for battery electrochemical state estimation. In another aspect, the system uses both coil-based measurement and ampere hour counting (AHC) measurement for SoC measurement. The system conducts coil-based SoC measurement only occasionally to reset the accumulated error of AHC-based SoC measurement. In yet another aspect, the system combines coil-based measurement with other measurements including battery internal resistance measurement, AHC measurement, and open circuit voltage (OCV) measurement to estimate SoH. Additional and alternative aspects are described herein.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIGS. 1A-B illustrate a side (A) and a perspective view (B) of inductive coil, high permeability sheet and current sensor arrangement for the system.

DETAILED DESCRIPTION

Figure 2:
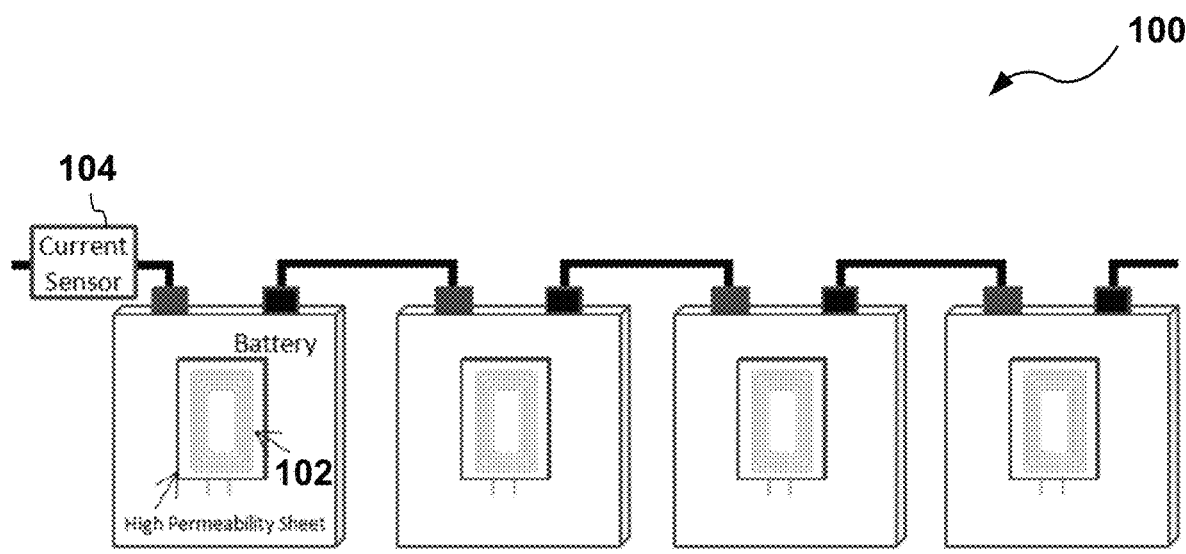
FIG. 2 illustrates perspective view of an example arrangement with multiple batteries.

The system and methods described herein provide technical advancements for rechargeable battery diagnostics based in improved measurements of electrochemical state (e.g. state of charge (SoC) and state of health (SoH). Accurately measuring the electrochemical state of rechargeable batteries is important for prolonging lifetime, maintaining performance, and preventing malfunctions or system failures of many electrical systems that rely on batteries such as electric vehicles (EV) and energy storage systems (ESS). Most mission-critical batteries have an in-built battery management system (BMS) that performs cell balancing, thermal management, and SoC/SoH estimation. Existing SoC and SoH estimation approaches, standing alone, are either too time-intensive or not accurate enough.

Battery State of Charge (SoC) Estimation

Open Circuit Voltage (OCV) Monitoring. Battery output voltage changes depending on its charging and discharging states. It shows the highest voltage when it is fully charged, and the lowest voltage when it is fully discharged. The state of charge (SoC) of a battery can be estimated by measuring its open-circuit voltage (OCV) and the pre-measured SoC versus OCV curve. In practice, a look-up table may provide a mapping between an OCV measurement and a state of charge.

OCV based SoC estimation have various issues. First, when the SoC is in the mid-range (ex: 20%-80%), the slope of the SoC vs OCV curve is much smaller than that of high and low SoC ranges. Because of the small slope, a small voltage measurement error can result in a large SoC estimation error. Second, SoC vs OCV curve depends on temperature, and proper temperature compensation is required for an accurate SoC estimation based on OCV measurements. Third, SoC vs OCV curve changes over aging. Unlike temperature, measuring or estimating the state of aging of a battery is not trivial, and the compensation of the aging effect is challenging. The biggest issue is that the battery terminal voltage in open circuit condition changes over time slowly towards its open-circuit voltage because of relaxation. The relaxation can take more than 24 hours in the worst case. Because of the relaxation, a battery needs to rest in open circuit conditions typically for more than 3 hours to measure an accurate OCV. Although the OCV-based SoC estimation method has much higher accuracy than most other existing methods, because of the requirement for a long resting time, it is not suitable for online applications.

Ampere Hour Counting (AHC). A system can track the amount of charge delivered to or drawn from a battery by integrating its current over time. The system can estimate the state of charge (SoC) of a battery utilizing the estimated amount of charge. SoC is typically estimated using the equation shown below.

$$SoC(t) = SoC(0) - \frac{T}{C_N} \int_{t_0}^{t} (\eta I(t) - S_d) dt$$

where;
SoC(0)=initial SoC
$C_N$=nominal capacity
$\eta$=coulombic efficiency
$S_d$=self-discharge rate Ampere hour counting (AHC) based SoC estimation has three issues. First, the accuracy of current sensing is crucial because the current sensing error accumulates over time through integration. For example, when the current sensor used in the system has an offset and the load current toggles between positive (discharging) and negative (charging) values, the error caused by the offset will increase over time and degrade the SoC estimation accuracy. Because all current sensors have an offset and the offset drifts over time, compensating for the error caused by the current sensor offset is very challenging. Second, the constants in the equation such as nominal capacity, coulombic efficiency, and self-discharge rate change over time resulting in increases in SoC estimation error. The biggest issue is that AHC based SoC estimation can provide only the changes in SoC ($\Delta$SoC), not the absolute SoC value. Because an absolute SoC value is required for battery management, the AHC-based method must be combined with other methods to provide an absolute SoC value. One example is combining the AHC method with the OCV method. The system can estimate the absolute SoC value using OCV based method after enough resting (off current condition)—for example after parking an electric vehicle overnight. Between the OCV based calibration points, the system can use AHC to estimate SoC, and the estimation error increases over time. If the increased error before the next calibration is within a tolerable range, the system can operate reliably. Consequently, the reliability of the system depends on the frequency of the calibration.

Impedance-based SoC Estimation. The internal impedance of the battery changes during charging and discharging. Hence, a system can estimate the SoC of a battery by measuring its internal impedance. Typically, impedances, both real and imaginary parts, are measured at plural frequencies.

Impedance-based SoC estimation has four issues. First, impedance is a strong function of temperature and state of aging as well, and separating the effect of SoC from the effect of temperature and aging is challenging. Second, for accurate estimation, impedance should be measured at high and very low frequencies, and measuring low-frequency impedance takes quite a long time which makes its online application challenging. Third, battery relaxation affects battery impedance, and compensating the effect of relaxation on impedance is not trivial. Fourth, its implementation is not simple. Because plural batteries are connected in series and parallel and the load and charging circuitry also contributes to the impedance, the impedance measurement circuitry has to be carefully designed to isolate the impedance of the target battery from the impedances of other batteries, load, and charging circuits. For the reasons, the method is mostly used in laboratories where the test conditions are tightly controlled and rarely used for online applications.

Equivalent Circuit Model (ECM) Based Method. More than one method can be used together to overcome the limitations of the individual method. One widely used method is using OCV and AHC together along with a battery equivalent circuit model (ECM). The method calculates the amount of charge delivered to or drawn from a battery utilizing the AHC method, estimates the changes in the open-circuit voltage (OCV) based on the amount of charge utilizing the OCV method, and finds the resulting terminal voltage (VT) utilizing the equivalent circuit model. The system compares the estimated terminal voltage and the measured terminal voltage to correct the estimated SoC value, and the correction process, typically implemented using Extended Kalman Filter (EKF), continues to keep the difference between the estimated and measured terminal voltages minimal.

The method is becoming popular because of its real-time adaptation capability but has several technical issues. The biggest issue is the accuracy of the equivalent circuit model and model parameters. Also, the SoC estimation accuracy heavily depends on the accuracy of the circuit model parameters-resistances and capacitance. Because the model parameters are a function of SoC, temperature, and battery aging state, real-time parameter extraction is required. There are several real-time parameter extraction methods but none of them are perfect and their accuracy degrades with battery aging. The problem becomes worse when a more accurate equivalent circuit model that has more model parameters is used.

Other Battery SoC Estimation Methods. Because of the importance of accurate SoC estimation and the limitations of the existing solutions, many methods are under development. One of them is a machine learning-based method that requires a large set of data for training. Collecting a large set of reliable data requires batteries connected to the internet synchronously or asynchronously, and the associated cost must be justified. Another one is an electrochemical model-based method utilizing a detailed battery electrochemical model incorporating mass transfer, thermal transfer, and thermodynamics equations. Because of its computational complexity, it has been used only for laboratory tests, not for online applications. The need for accurate SoC estimation is driving the development of new methods.

Existing methods that utilize an inductive coil and Eddy current loss associated with AC magnetic field to measure battery SoC ignored the effect of battery current that is not related to battery electrochemical state. The AC magnetic field generated by exciting an inductive coil induces Eddy current loss and the loss associated with moving charged particles—battery current. The Eddy current loss depends upon the electrochemical state of the battery, but the loss associated with moving charged particles depends upon battery current. Without compensating the effect of battery current, battery SoC estimation utilizing an inductive coil will result in large unpredictable errors particularly for online applications where battery current continuously changes.

Accordingly, a system and methods for rechargeable battery diagnostics is provided. By way of introductory example, the system may include an inductive coil placed on the side of a battery and a current sensor measuring the battery current. A thin planar inductive coil is preferred, and the preferred orientation of the planar coil is in parallel with the electrode plates in the battery. When attached to the side of a battery, it will minimally affect the form factor of the battery. A sheet of high magnetic permeability material can be placed on top of the inductive coil to reduce interference. The size (area) of the inductive coil and the optional sheet is smaller than the area of the battery where the coil is attached. When multiple batteries are connected in series, each battery can have its own inductive coil and the multiple batteries can share one current sensor. The system also can have a temperature sensor to measure temperature and use the measured temperature for temperature compensation. In another example embodiment, one inductive coil is sandwiched between two batteries without a high magnetic permeability sheet, so the coil can measure the electrochemical state of the two batteries simultaneously.

The inductive coil may be excited using an AC signal with a fixed frequency and generates AC magnetic fields in the battery. The frequency and strength of the induced magnetic field are adjusted to make sure that the magnetic field in the battery under measurement is strong enough to induce physical absorption inside of the battery and the strength of the magnetic field on the other side of the battery (outside) is negligible. A high excitation frequency over 5 MHz is preferred to increase induced Eddy current and sensitivity. The types of physical absorption that can be used for battery state estimation is Eddy current loss because Eddy current changes depending upon the physical and chemical properties of battery electrodes and electrolyte, and the properties of battery electrodes and electrolyte change depending upon the battery electrochemical state. Another physical loss, that is unwanted yet unavoidable, is induced by battery current in response to the AC magnetic field. When electrically charged particles such as electrons or Li ions in Li-based rechargeable batteries move in a magnetic field, a force perpendicular to the direction of the particle motion and the magnetic field vector is applied to the moving charged particles. The force results in a displacement of the charged particles which results in additional loss proportional to the battery current. Because the loss induced by the battery current is not related to the electrochemical state of the battery, the loss must be excluded for an accurate battery state estimation. The system may utilize the battery current data measured by a current sensor to eliminate the effect of battery current when estimating the electrochemical state of batteries. The system may stores the relation between the battery current and the current induced loss at different temperatures in the form of lookup tables or mathematical formulas and uses the lookup tables or the mathematical formulas to correct the effect of battery current. For applications such as electric vehicles (EV) and energy storage systems (ESS), compensating the effect of battery current is crucial for online battery state estimation.

Other aspects provide technical advancements for efficient signal measurement. A tuning capacitor may be connected to the inductive coil in series or parallel to form an LC tank to boost and regulate the coil current. When the tuning capacitor is connected in parallel to the inductive coil to form a parallel LC tank, a sensing element (a resistor or a capacitor) is connected to the LC tank in series, and the impedance of the series-connected sensing element at the operating frequency is less than 10% of the LC tank impedance. When the tuning capacitor is connected in series to the inductive coil to form a series LC tank, the tuning capacitor itself serves as a sensing element. The system may calculate the complex impedance, complex power, power factor, coil inductance, and/or coil resistance of the inductive coil by measuring the voltage (both amplitude and phase) across the sensing element. The system may improve the measurement accuracy by measuring the input voltage (both amplitude and phase) applied to the LC tank as well. Using the measured input voltage instead of using a pre-known input voltage minimizes the adversary effect of circuit variations. The system may optionally use a mixer to bring down the frequency of the electrical signals and hence to use a low-speed analog-to-digital converter (ADC) for signal processing. The electrochemical state of a battery is determined based on the measured impedance, power, power factor, coil inductance, and/or coil resistance after compensating the effect of battery current. The system can also compensate for the effect of temperature using the measured temperature to further improve accuracy.

In some examples, the system may apply inductive coil-based battery SoC estimation sporadically or periodically, and apply ampere hour counting (AHC) based SoC estimation between the intervals. The error of AHC-based battery SoC estimation increases with time, and the error will be reset when the inductive coil-based battery SoC estimation is activated. The system may set or control the interval length to be not too long, so the error of AHC-based battery SoC estimation remains within a target range.

In some examples, the system combines the inductive coil-based battery state estimation method with other battery state of health (SoH) estimation methods such as internal resistance measurement and equivalent circuit model (ECM) based estimation to improve SoH estimation accuracy. For example, battery internal resistance can be relatively easily measured and is a function of battery SoC, SoH, and temperature. If the system can find SoC separately, it can accurately estimate battery SoH using the measured internal resistance and SoC values. The system may use the inductive coil-based battery SoC estimation value and the battery internal resistance value to estimate an accurate battery SoH value. In another example, the inductive coil-based battery SoC estimation method can be combined with open circuit voltage (OCV). The relation between OCV and SoC changes depending upon battery SoH. OCV can be measured after long resting such as overnight parking of an electric vehicle. When an accurate OCV measurement is available, the system can perform inductive coil-based SoC measurement, and use the SoC and OCV values to estimate SoH. In yet another example, the system can use the SoC value measured at the full-charge condition to estimate SoH. CCCV (constant current and constant voltage) method is commonly used for charging electric vehicle batteries. Battery SoC at full-charge condition degrades over battery aging, SoH. The system may measure SoC using the inductive coil-based method when the battery is at the full-charge condition and use the measured SoC value to estimate SoH.

Additional benefits, efficiencies, improvements and aspects are made evident in the system and methods described below.

FIG. 1A-B illustrates a first example of a battery diagnostic system 100 (the system). The system may be include components which attach to a battery or (or batteries). In some examples, the battery (or batteries) may be included in the system as well. The FIG. 1A illustrates an example of the system and a side view of the battery. FIG. 2B illustrates an example of the system and a front view of the battery. Reference to FIGS. 1A and 2B follows the following discussion.

The system 100 may include an inductive coil 102 and a current sensor 104. The current sensor 104 may include a sensor that generates a signal indicative of current through a conductor attached to a terminal 106 of the battery. The battery may be attached to either the anode or cathode terminal. By way of example, the current sensor 104 may include a resistive current sensor connected in series to the current carrying wire, an invasive Hall current sensor connected in series to the current carrying wire, a non-invasive Hall current sensor installed around a wire, and a magneto-resistive current sensor installed around a wire. In general, any type of current sensor can be used, and the current sensor can be installed on the anode side or on the cathode side of the battery.

The coil 104 may include a inductive coil placed on the side of a battery and a current sensor measuring the battery current, as shown in FIG. 1A-B. For example, the inductive coil may include a thin planer coil. The preferred orientation of the inductive coil is in parallel with the electrode plates 108 in the battery such that the plane formed by the coil is electrode substance parallel with the planes in the battery. The coil, when attached to the battery, may have a side that faces the battery and another side that faces away from the battery.

In some examples, a sheet of high magnetic permeability material can be placed on top of the inductive coil 102 to reduce interference. The sheet of magnetically permeable material may be applied to the inductive coil 102 on side the inductive coil 102 that faces away from the battery B. The area of the thin coil will be smaller than the area of the side of the battery in which the coil is attached.

FIG. 2 illustrates an example of the system with multiple batteries. For many practical applications such as electrical vehicles (EV) and energy storage systems (ESS), multiple batteries are connected in series and/or parallel. For multiple batteries connected in series, each battery may share a current sensor as shown in FIG. 2. Each of the batteries may have a separate coil.

Figure 3:
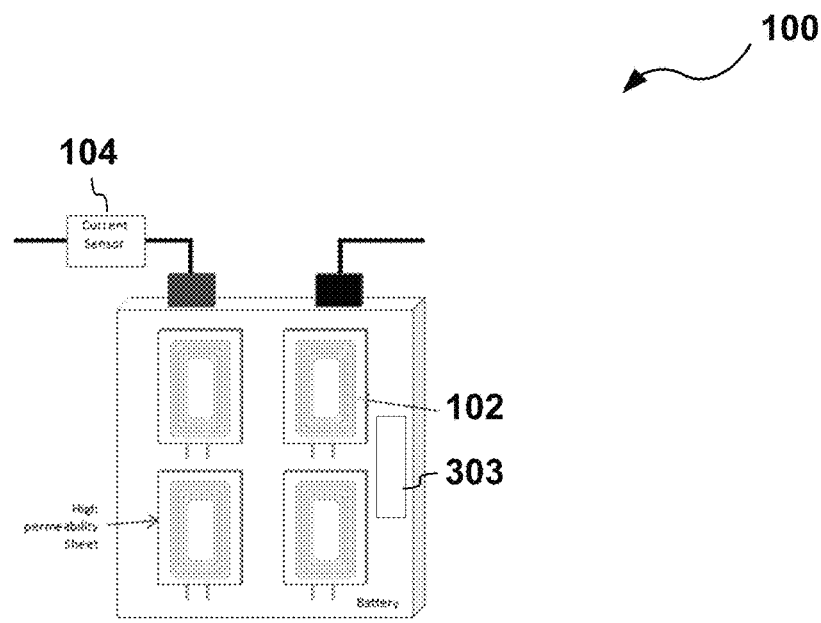
FIG. 3 Illustrates a perspective view of an example arrangement with multiple coils per battery.

FIG. 3 illustrates an example of the system in which a battery has multiple inductive coils. The multiple inductive coils on a battery may be used for determining the spatial distribution of electrochemical states of a battery. The system can also have a temperature sensor 303 or multiple temperature sensors and use the measured temperature for temperature compensation.

Figure 4A:
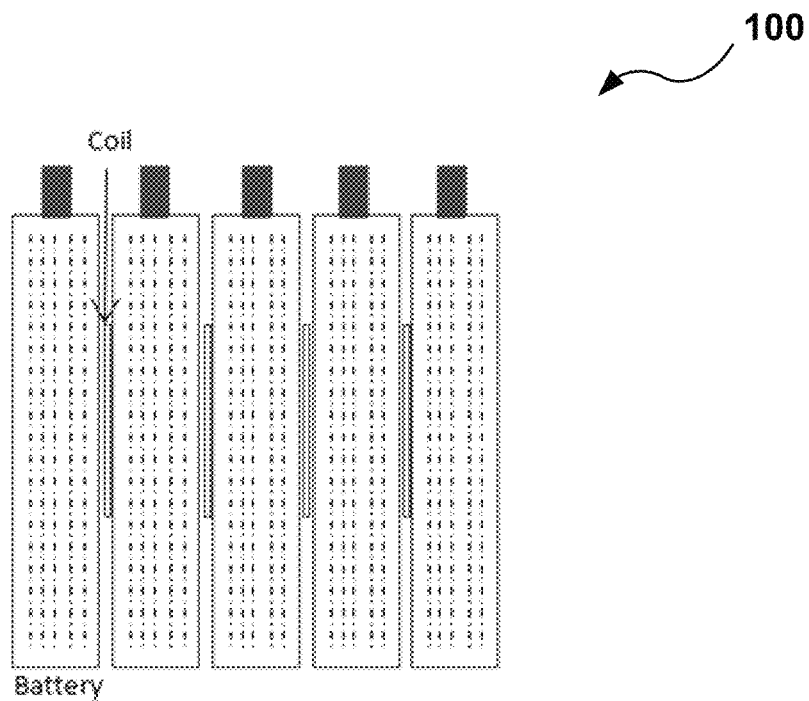
FIGS. 4A-B illustrate side views of example arrangements of the system with without high magnetic permeability sheet (A) and with high magnetic permeability sheets (B).
Figure 4B:
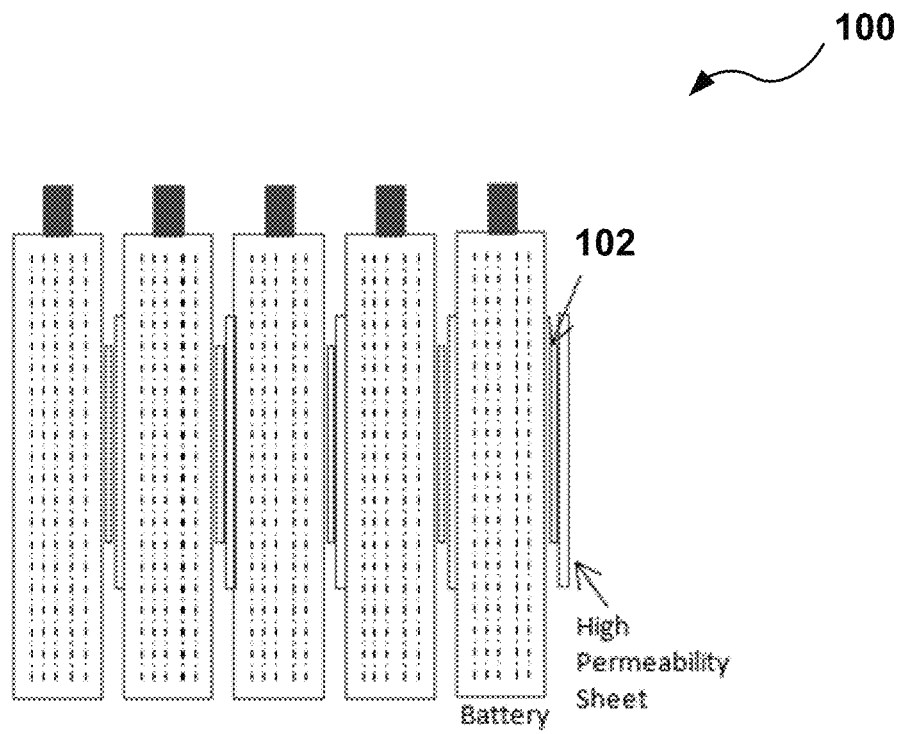

FIG. 4A-B illustrates an example of the system inductive coils positioned between multiple batteries. When monitoring electrochemical states of multiple batteries, an inductive coil can be sandwiched between two batteries without a high magnetic permeability sheet, as shown in FIG. 4A, and the inductive coil can be used to estimate the average electrochemical state of the batteries sandwiching it. When high magnetic permeability sheets are used, as shown in FIG. 4B, the system can measure the electrochemical state of individual batteries independently.

Figure 5A:
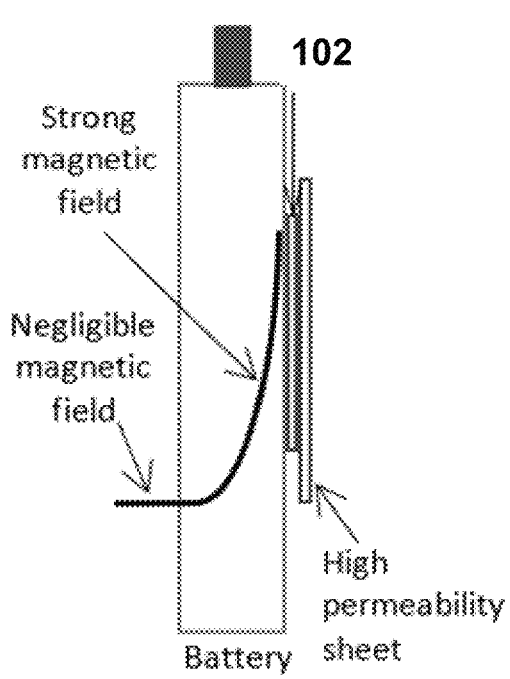
FIGS. 5A-C illustrate block diagrams showing magnetic field strength distributions for different example arrangements of the system.
Figure 5B:
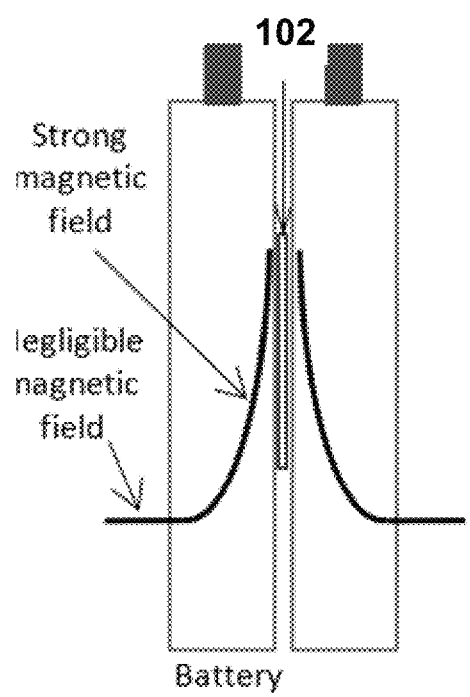
Figure 5C:
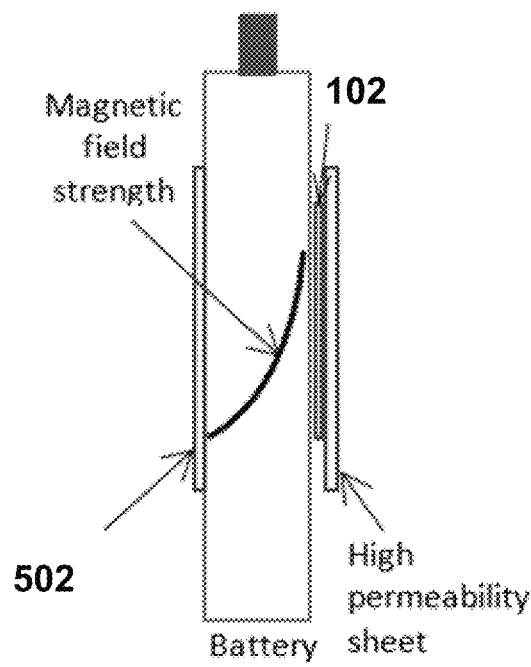

FIG. 5A-C illustrate a strength curve of the magnetic field for various inductive coil configurations. The inductive coil may be excited using an AC signal with a fixed frequency and may generate AC magnetic fields in the battery. The generated magnetic field strength decays rapidly with increasing distance from the coil, and the system adjusts the coil current to generate a strong magnetic field inside of the battery but a negligibly weak magnetic field in the outside area of the battery. As illustrated in FIG. 5A, when a high magnetic permeability sheet covers the coil, magnetic fields will be formed only on one side of the coil. Without the sheet, magnetic fields will be formed on both sides of the coil. As illustrated in FIG. 5B, a battery may be placed on either side of the coil, respectively (see also FIG. 4A). In some examples, an additional high magnetic permeability sheet 502 can be placed on the opposite side of the battery, as shown in FIG. 5C, to block the magnetic fields leaking to the outside of the battery.

Figure 6A:
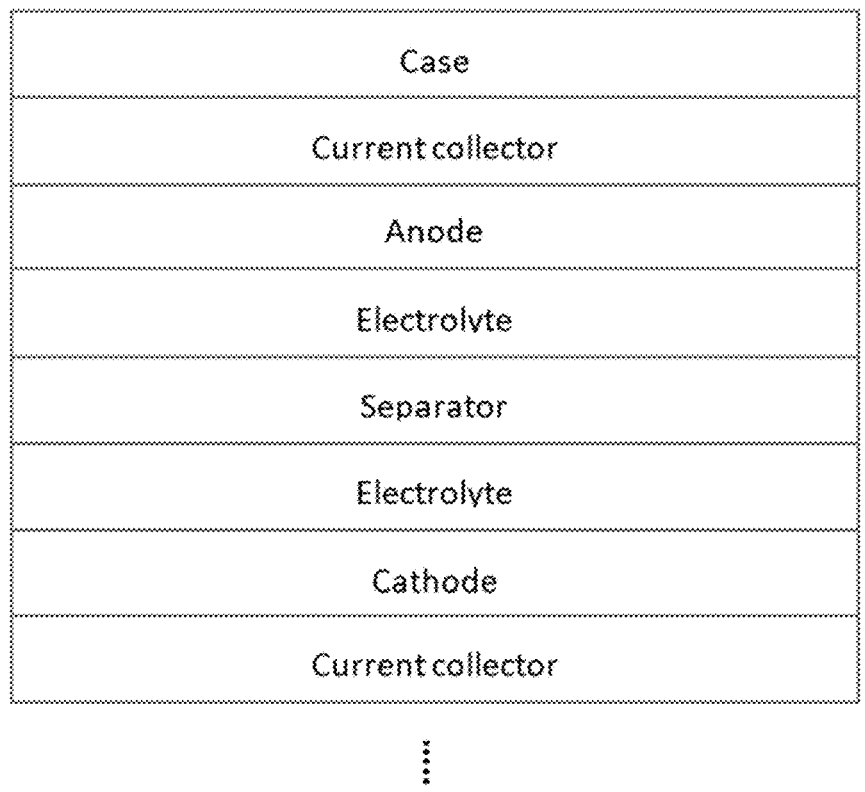
FIGS. 6A-B illustrate cross sectional views of typical rechargeable batteries, liquid electrolyte battery (A) and solid electrolyte battery (B).
Figure 6B:
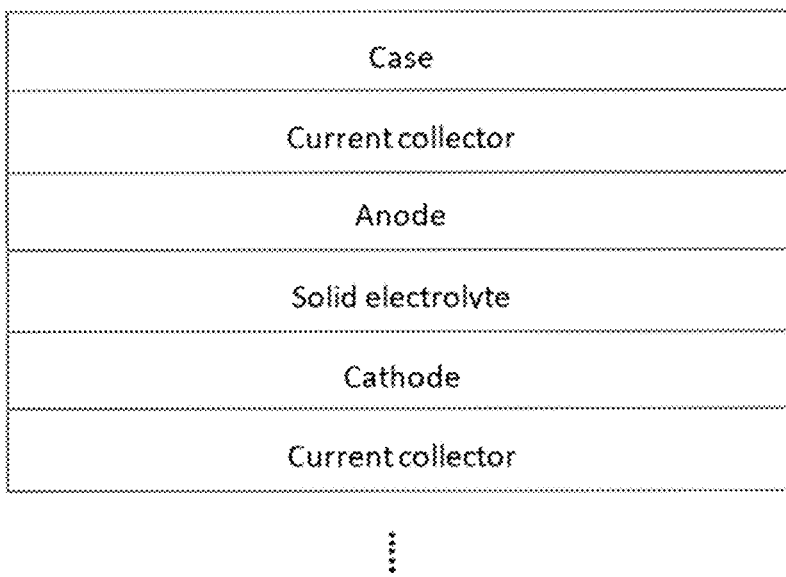

FIG. 6A-B shows a simplified cross-sectional view of Li ion batteries—prismatic and pouch cells. The example uses Li ion batteries, but any kind of Li or non-Li based rechargeable batteries are suitable. FIG. 6A-Bs shows only one layer of anode-cathode combination for simplicity. Most batteries have multiple layers, and the magnetic fields penetrate over multiple layers.

The magnetic fields induce Eddy currents in the materials constituting the battery. The Eddy current losses in the battery case, if the case material is conductive, in the anode-side current collector metal, and in the cathode side current collector metal are fixed because they do not or minimally change with battery electrochemical states. The Eddy current losses in the anode, electrolyte, separator, and cathode depend upon the battery electrochemical state. For example, with charging and discharging, the Li contents in the anode and cathode change, and their resistances and densities change as well. Consequently, Eddy current losses in anode and cathode change depending upon battery charging and discharging states. It is common that anode, electrolyte, and cathode materials have very different electrical resistivities and densities, and the one that has the lowest resistivity and density shows the biggest level of Eddy current loss. The system can determine the battery electrochemical state by measuring the level of Eddy currents. However, there is another loss mechanism associated with the AC magnetic field and battery current. When an electrically charged particle such as an electron or Li ion moves in a magnetic field, a force perpendicular to the direction of the motion of the particle and the magnetic field vector is applied to the particle. Because the magnetic field is AC and the battery current changes much slower than the AC coil excitation frequency, the force changes its direction periodically at the excitation frequency. The force results in the displacement of the particle which results in an extra loss. Because battery current is essentially a group motion of electrons and Li ions in the case of Li ion batteries, the extra loss is proportional to battery current.

Figure 7A:
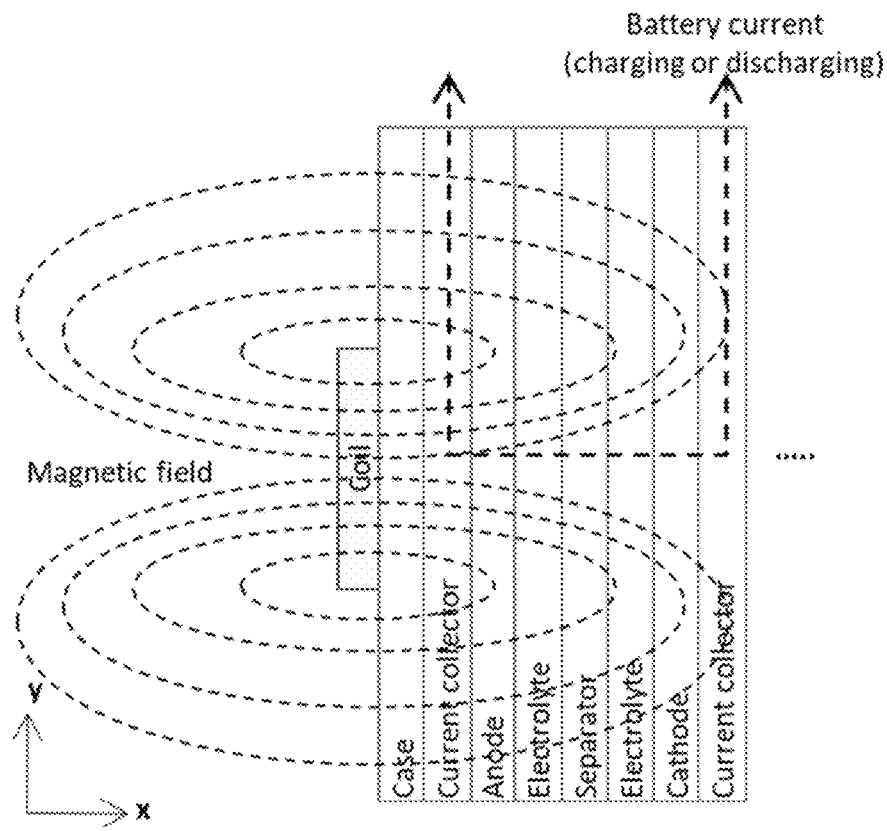
FIGS. 7A-B illustrate magnetic field direction vs charged particle motion direction, coil with no high permeability sheet (A) and coil covered with a high magnetic permeability sheet (B).
Figure 7B:
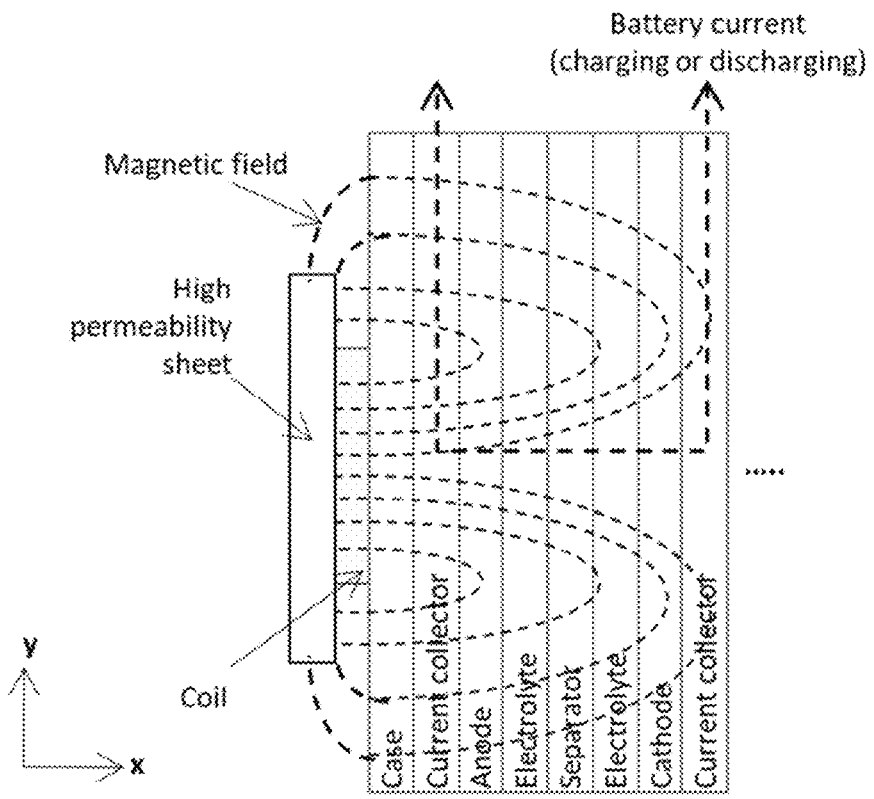

FIG. 7A-B conceptually shows the magnetic fields induced by an inductive coil and the motion of electrons and Li ions in a battery. In anode, electrolyte, and cathode, electrons and Li ions drift mostly in the x-direction, and the magnetic fields have a certain level of y-direction and z-direction components except for the center point of the coil. The y- and z-direction components are small in the center area of the coil, and big under the coil wire area. In anode and cathode current collectors, electrons mostly drift in the y-direction, and the magnetic fields have a strong x-direction component. Because aligning carrier (electron and Li ion in the case of Li ion batteries) motion direction and the magnetic field vector direction in the entire battery volume is practically impossible, a portion of the magnetic fields is always perpendicular to the direction of motion of electrically charged particles and consequently, there is always an extra loss proportional to battery current unless battery current is zero. Because the extra loss is associated with battery current but not with battery electrochemical state, the system must exclude or compensate it for an accurate battery electrochemical state estimation.

The system may utilize the battery current data measured by a current sensor to exclude the effect of battery current when estimating the electrochemical state of a battery. The system may store the relation between battery current and current-induced loss at different temperatures in the form of lookup tables or mathematical formulas and uses the lookup tables or mathematical formulas to exclude the effect of battery current. For applications such as electric vehicles (EV) and energy storage systems (ESS) where multiple batteries are used and battery charging and discharging events frequently happen, compensating the effect of battery current is crucial for accurate online battery state estimation.

Figure 8A:
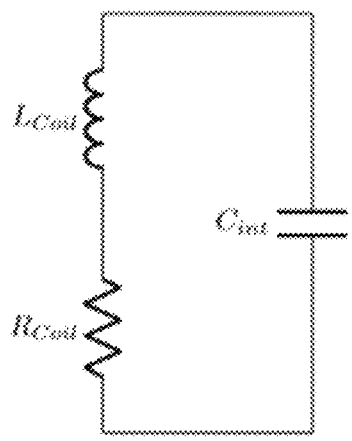
FIGS. 8A-C illustrate inductive coil equivalent circuit (A), with an additional tuning capacitor ($C_{tune}$) connected in series (B) and with an additional tuning capacitor ($C_{tune}$) connected in parallel (C), where $C_{battery}$ is an additional parasitic capacitance added by battery.
Figure 8B:
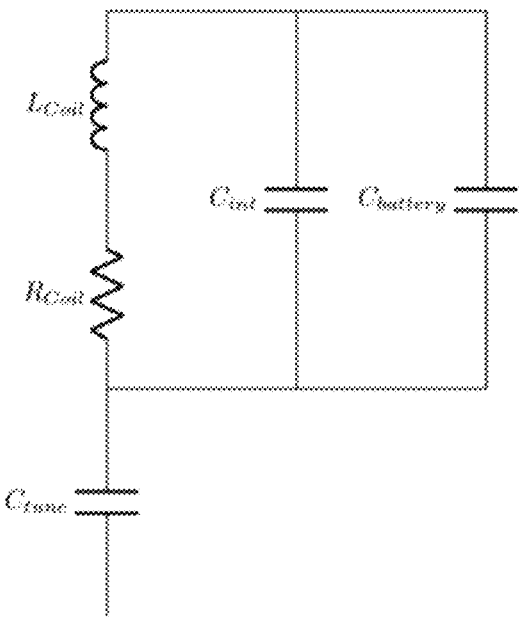
Figure 8C:
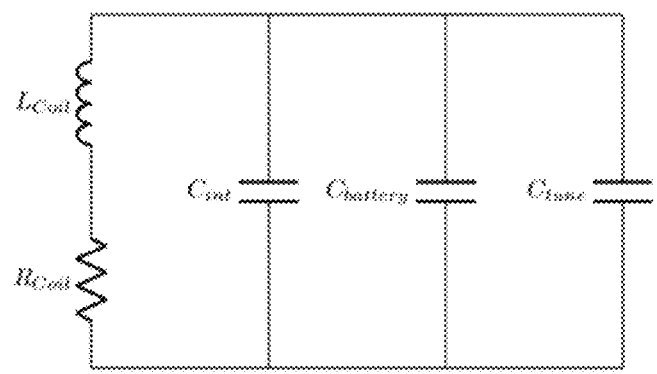

FIG. 8A-C illustrates an example of the system with a tuning capacitor to provide efficient signal measurement. The tuning capacitor ($C_{tune}$) may be connected to the inductive coil in series (FIG. 8A) or parallel (FIG. 8B) to form an LC tank, and to boost or regulate the coil current. When a tuning capacitor is connected in series and the LC tank is excited close to its resonance frequency, the voltage across the inductive coil is higher than the input voltage ($V_{IN}$) applied to the LC tank which provides a high coil current. When a tuning capacitor ($C_{tune}$) is connected in parallel to an inductive coil, the coil current is higher than the LC tank input current ($I_{IN}$) if the excitation frequency is close to the LC tank resonance frequency and the LC tank quality factor is bigger than one.

Figure 9:
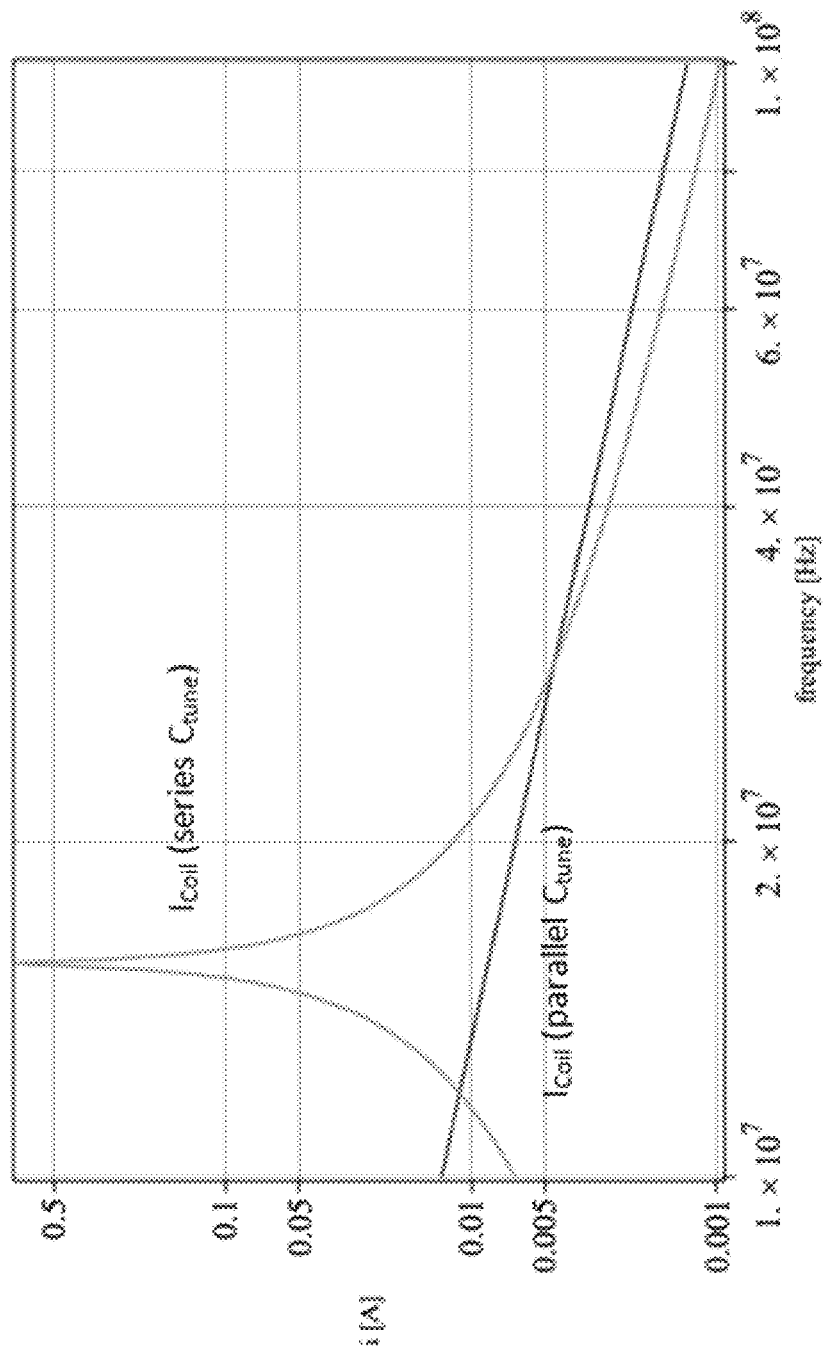
FIG. 9 Illustrates current through inductive coil for series and parallel connected tuning capacitor for the system.
Figure 10A:
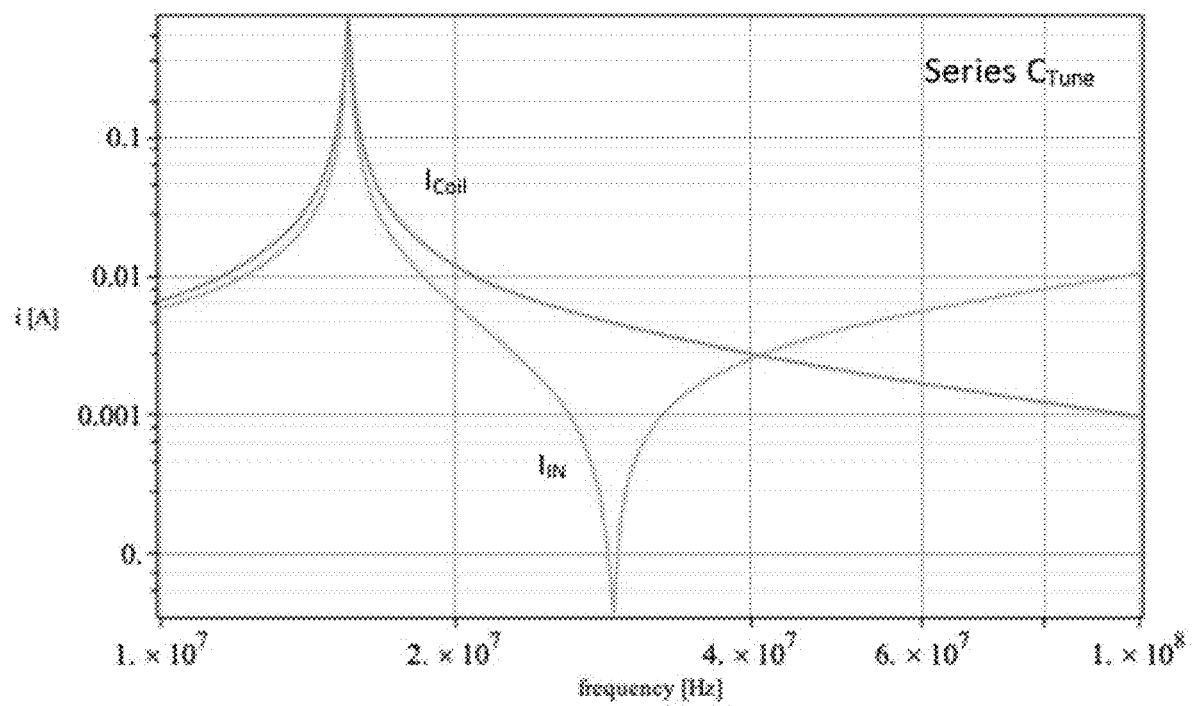
FIGS. 10A-B illustrate current through coil and input current for series and parallel tuning capacitors.
Figure 10B:
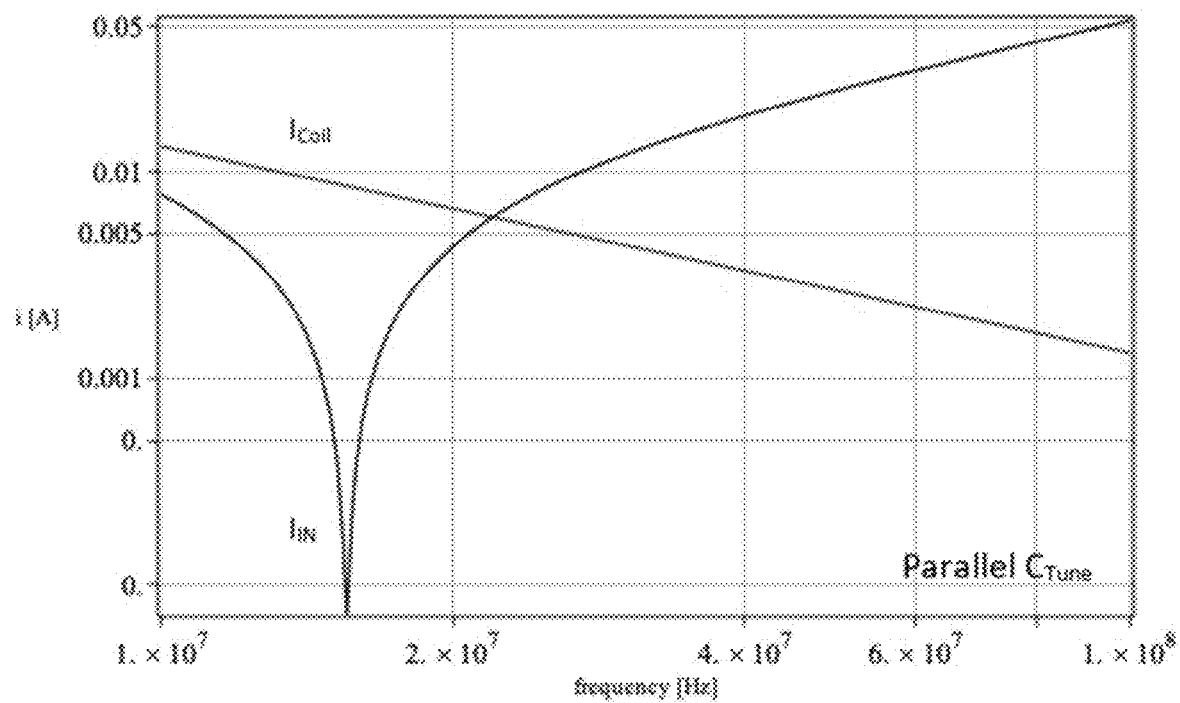

FIG. 9 shows inductor coil currents for series-connected LC tank and parallel-connected LC tank under the same input voltage ($V_{IN}$) and resonance frequency conditions. Series LC tank shows much higher inductor coil current near the resonance frequencies than that of parallel LC tank because of its voltage boosting. Higher coil current generates a stronger magnetic field and could provide higher signal-to-noise ratios and sensitivities for the measurements. However, for the series LC tank connection, its input current is almost the same with the inductor coil current, as shown in FIG. 10A. For parallel connection, the inductor coil current is much higher than the input current ($I_{IN}$), as shown in FIG. 10B, because of its current boosting effect, and the inductor current is a weak function of signal frequency making it more linear and more resilient to circuit variations. The choice between series and parallel must be made based on design metrics including sensitivity, power consumption, and linearity. To measure complex impedance and complex power, the system may measure the input current ($I_{IN}$), both amplitude and phase.

Figure 11A:
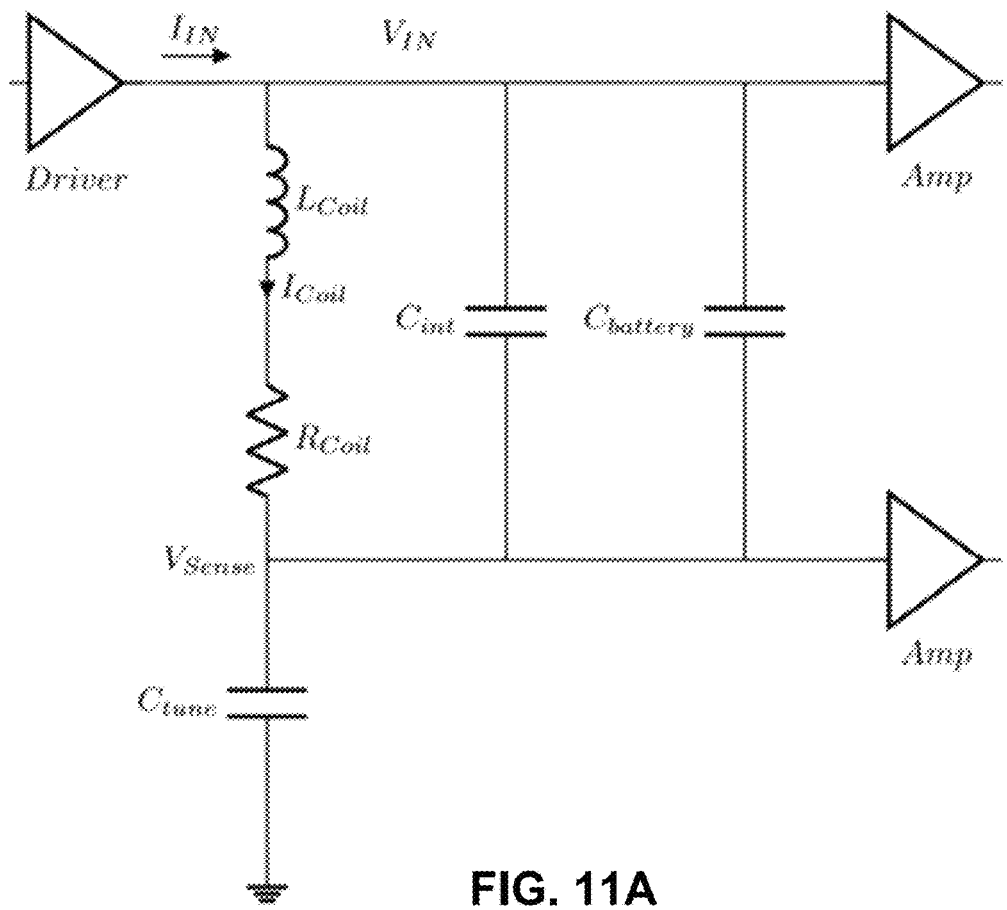
FIGS. 11A-B illustrate sensing circuit arrangements according to various aspects of the system with a first arrangement having a series connected tuning capacitor (A) and a second arrangement having a parallel connected tuning capacitor (B), where the amplifier connected to $V_{IN}$ node is optional. A resistor (RSENSE) can be used instead of $C_{Sense}$ in (B).
Figure 11B:
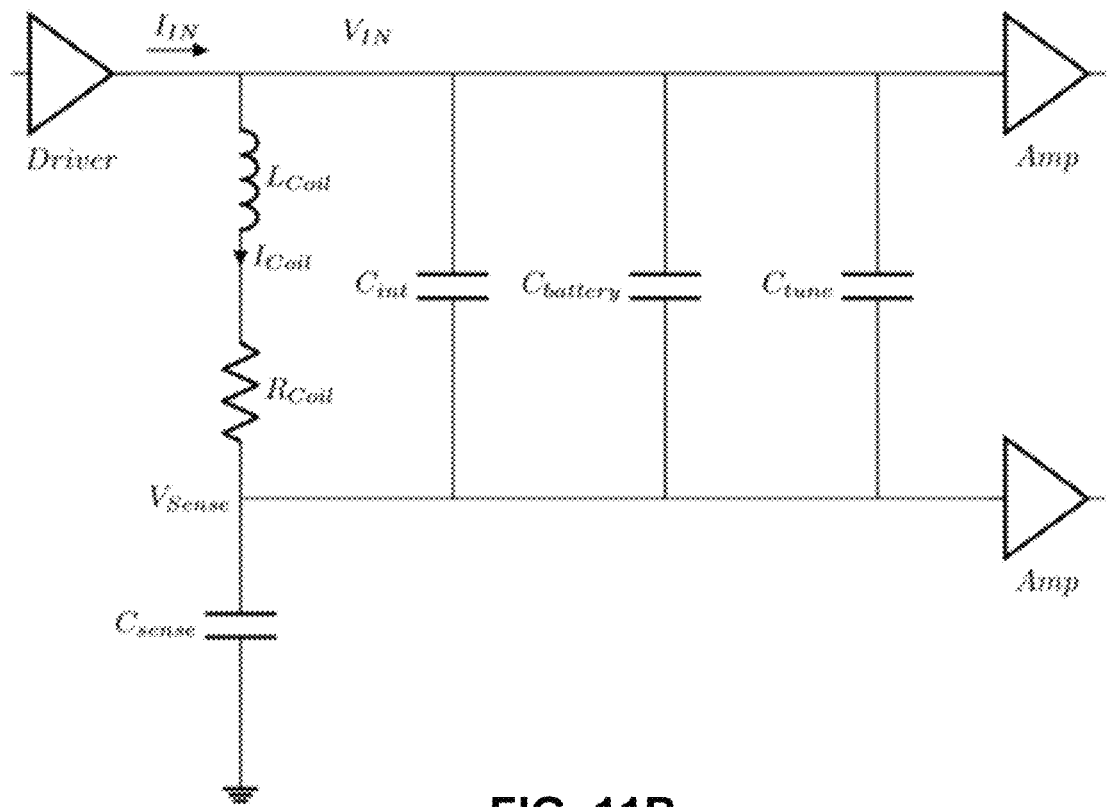

For parallel connection, an additional element, a resistor or a capacitor, can be used to sense the current as shown in FIG. 11B. A capacitor is preferred because it blocks DC signal. For series connection, the series-connected tuning capacitor ($C_{tune}$) itself can be used as a current sensing element, as shown in FIG. 11A, eliminating the need for a separate sensing element.

Because the system knows the input voltage $V_{IN}$, it can use the known input voltage $V_{IN}$ to calculate complex impedance and complex power or can use additional circuitry to measure $V_{IN}$. Using measured $V_{IN}$ would help to minimize the uncertainty introduced by the output impedance of the driving amplifier, which may suffer from temperature and process variations. Once $V_{IN}$ and $V_{SENSE}$ are measured, the system can calculate complex impedance and complex power. If required, the system can also calculate the inductive coil inductance $L_{Coil}$ and resistance $R_{Coil}$.

Described below are the equations for parallel connection:

$$I_{IN} = \frac{V_{Sense}}{Z_{Sense}}$$

where,
$I_{IN}$=input phasor current
$V_{Sense}$=phasor voltage across $C_{Sense}$ (or Rsense if resistor is used for current sensing)
$Z_{Sense}$=impedance of current sensing element at the excitation frequency $$Z_{LC} = \frac{(V_{IN} - V_{Sense})}{I_{IN}} = \frac{1}{Y_{LC}}$$

where,
$V_{IN}$=Input phasor voltage
$Z_{LC}$=LC tank impedance
$Y_{LC}$=LC tank admittance $$S_{LC} = \frac{(V_{IN} - V_{Sense})I_{IN}^*}{2}$$

where,
$S_{LC}$=complex power of the parallel LC tank
$I_{IN}^*$=complex conjugate of input phasor current $$PF_{LC} = \frac{\text{Re}\{S_{LC}\}}{|S_{LC}|}$$

where,
$PF_{LC}$=power factor of the parallel LC tank
Assuming all capacitance values are known, $$Y_{Coil}=Y_{LC}-j\omega(C_{int}+C_{battery}+C_{tune})$$

where,
$Y_{Coil}$=admittance of the branch that has inductor and resistor
$C_{int}$=intrinsic parasitic capacitance of the inductive coil
$C_{battery}$=additional capacitance added by battery
$C_{tune}$=tuning capacitor added to form parallel LC tank $$L_{Coil} = \frac{\text{Im}\left\{\frac{1}{Y_{Coil}}\right\}}{2\pi f}$$

where,
$L_{Coil}$=coil inductance
f=excitation frequency $$R_{Coil} = \text{Re}\left\{\frac{1}{Y_{Coil}}\right\}$$

where,
$R_{Coil}$=coil parasitic resistance
Shown below are the equations for series connection:

$$I_{IN} = \frac{V_{Sense}}{Z_{Sense}}$$

where,
$I_{IN}$=input phasor current
$V_{Sense}$=phasor voltage across $C_{Tune}$
$Z_{Sense}$=impedance of current sensing element $C_{Tune}$ at the excitation frequency $$Z_{LC} = \frac{(V_{IN} - V_{Sense})}{I_{IN}} = \frac{1}{Y_{LC}}$$

where,
$V_{IN}$=Input phasor voltage
$Z_{LC}$=LC tank impedance without $C_{Tune}$
$Y_{LC}$=LC tank admittance without $C_{Tune}$ $$S_{LC} = \frac{(V_{IN} - V_{Sense})I_{IN}^*}{2}$$

where,
$S_{LC}$=complex power of the inductive coil including parasitic capacitance
$I_{IN}^*$=complex conjugate of input phasor current $$PF_{LC} = \frac{\text{Re}\{S_{LC}\}}{|S_{LC}|}$$

where,
$PF_{LC}$=power factor of the inductive coil including parasitic capacitance
Assuming all capacitance values are known, $$Y_{Coil}=Y_{LC}-j\omega(C_{int}+C_{battery})$$

where,
$Y_{Coil}$=admittance of the branch that has inductor and resistor
$C_{int}$=intrinsic parasitic capacitance of the inductive coil
$C_{battery}$=additional capacitance added by battery $$L_{Coil} = \frac{\text{Im}\left\{\frac{1}{Y_{Coil}}\right\}}{2\pi f}$$

where,
$L_{Coil}$=coil inductance
f=excitation frequency $$R_{Coil} = \text{Re}\left\{\frac{1}{Y_{Coil}}\right\}$$

where,
$R_{Coil}$=coil parasitic resistance

The system determines the battery electrochemical state using the calculated complex impedance $Z_{LC}$, inductance $L_{coil}$, resistance $R_{Coil}$, complex power $S_{LC}$ and/or power factor $PF_{LC}$.

Figure 12:
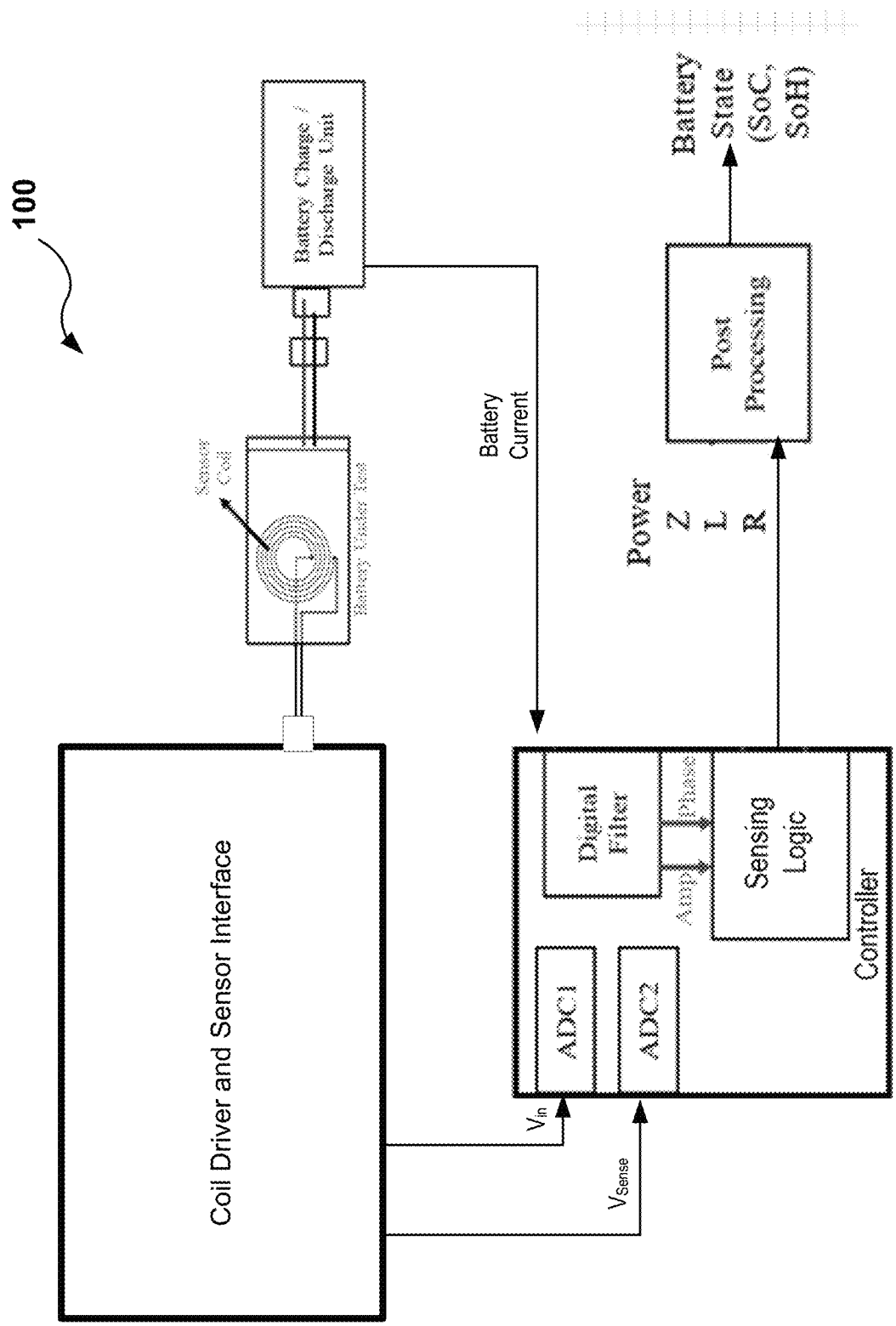
FIG. 12 illustrates an exemplary system according to various aspects.

FIG. 12 illustrates an example of the system. The system may include a coil driver and sensor interface. The coil driver may send current to one or more coils to batteries monitored by the system. The sensor interface may measure $V_{in}$ and $V_{Sense}$. In some examples, the sensor interface may down-converts these signals to a lower frequency.

The system may further include a battery current control unit. The battery current control unit may measure the current across the current sensor. Alternatively or in addition, the battery current control unit may control the battery current applied to a battery under test.

The system may include a controller. The controller may receive $V_{in}$ and $V_{sense}$. The controller may convert the signals into digital using ADC and collects battery current data from the battery current control unit. The controller may calculate the amplitude and phase of the voltage signals first and calculates complex power, power factor, complex impedance, coil inductance, and coil resistance using the voltage signals and correct them using the current data. The microprocessor or a separate computing unit determines battery electrochemical states such as SoC and SoH utilizing the measured complex power, power factor, complex impedance, coil inductance, and/or coil resistance.

Figure 13A:
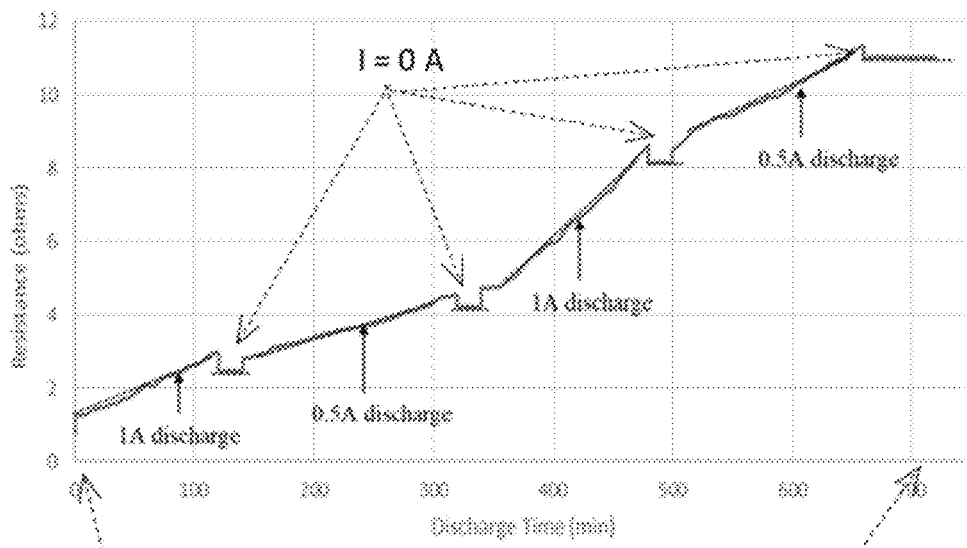
FIGS. 13A-C illustrate example measurement results using the system according to various aspects where coil resistance (A), coil inductance (B) and battery terminal voltage (C) was measured during battery discharging.
Figure 13B:
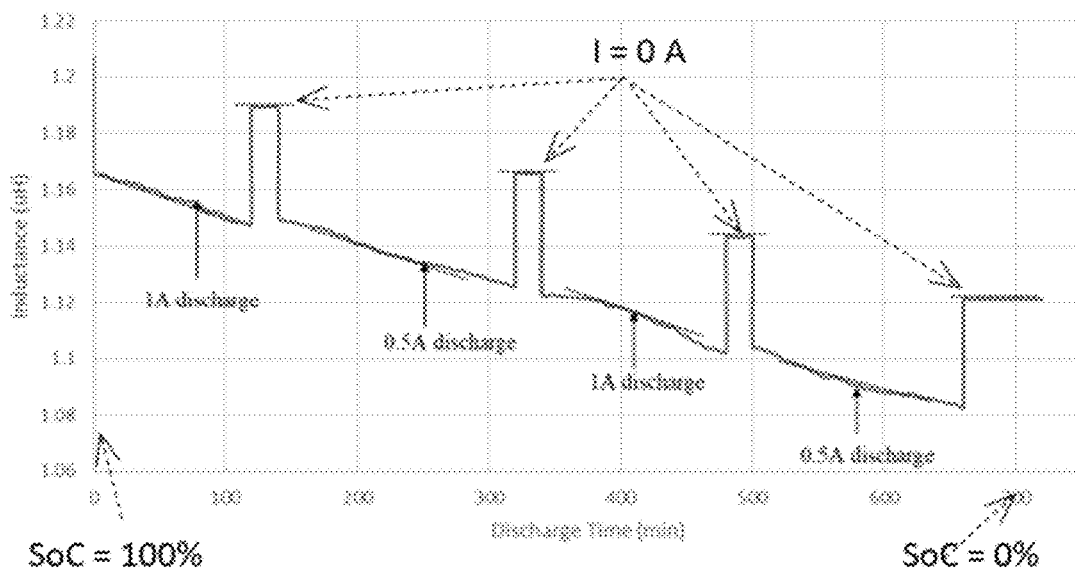
Figure 13C:
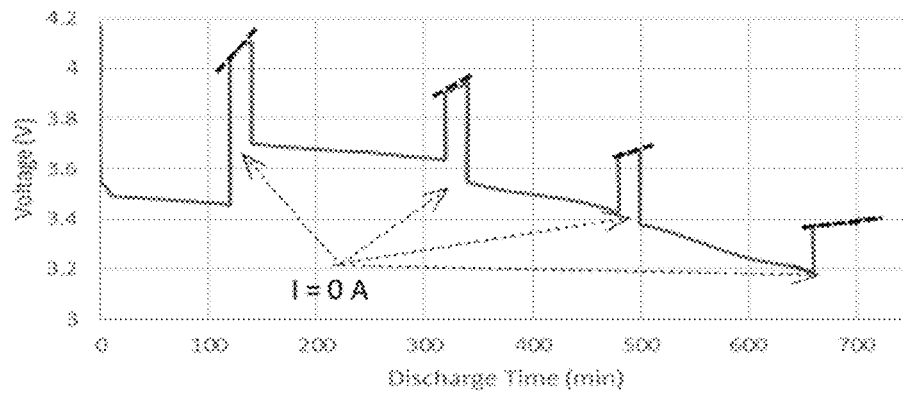

FIG. 13A-C shows the measured inductive coil resistance, inductance, and terminal voltage during battery discharging for a 10 Ah Li-polymer battery. When current turns on and off, the calculated resistance and inductance change because of the extra loss caused by moving electrically charged particles. It clearly shows that the effect of moving charged particles (battery current) is significant, proportional to the battery current, and must be excluded for an accurate battery electrochemical state estimation. FIG. 13A-C also shows that the system does not suffer from battery polarization and relaxation. When battery current is zero, the battery terminal voltage keeps changing toward its open circuit voltage (OCV) because of battery polarization and relaxation. The relaxation typically takes several hours which makes terminal voltage-based battery electrochemical state estimation practically impossible.

Figure 14:
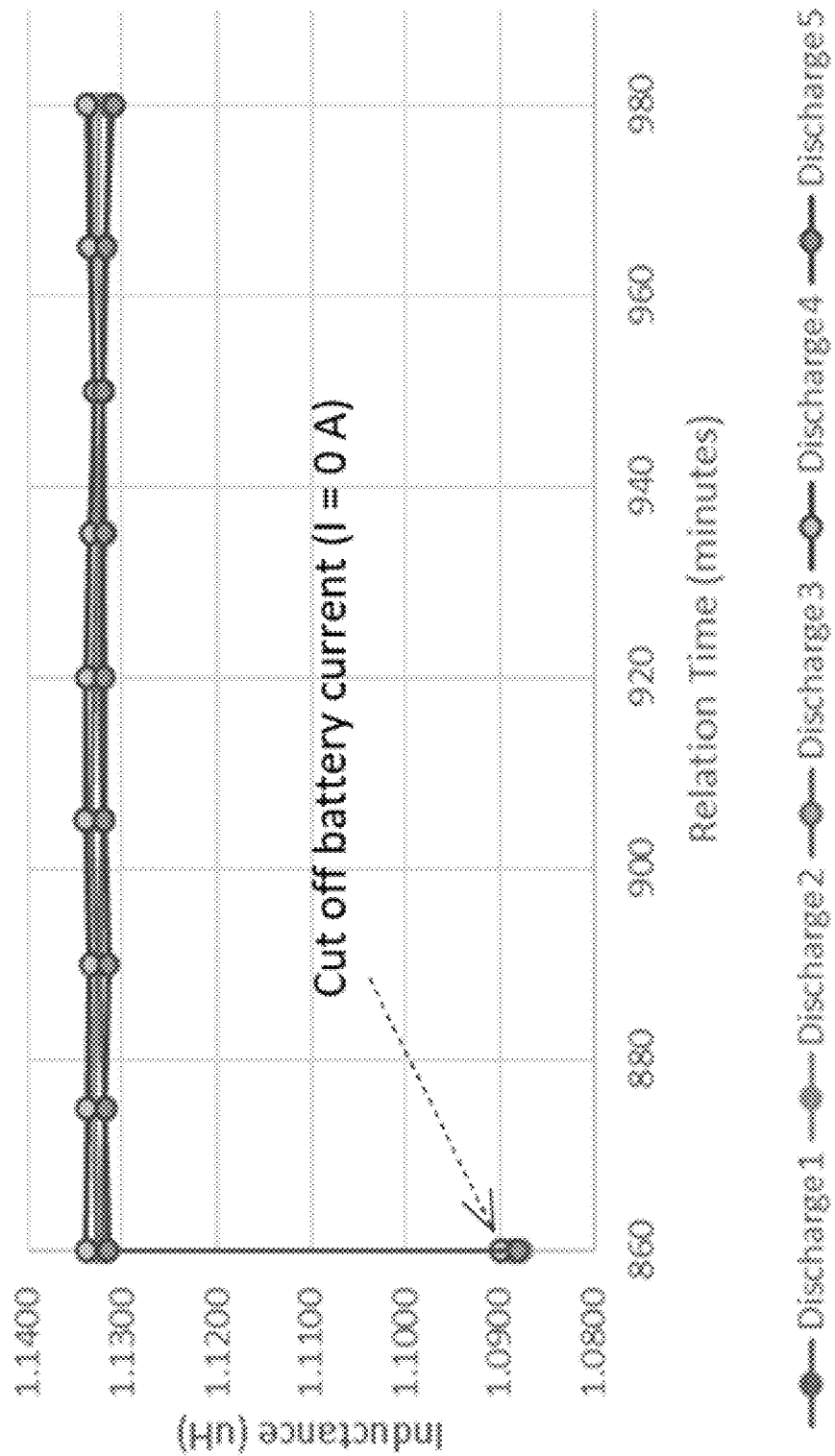
FIG. 14 illustrates example measurement results conducted to check the effect of battery relaxation using an exemplary system according to various aspects.

FIG. 14A-C shows the changes in the measured inductance over two hours after cutting off the battery current, and it clearly shows that the inductance does not change over the two hours period. Unlike the battery terminal voltage, the measured impedance, power, power factor, coil inductance, and coil resistance do not show any effect of battery polarization and relaxation. It means that the system can perform the battery electrochemical state estimation including the compensation for the loss induced by battery current at any time almost instantly without worrying about battery polarization and relaxation. No existing system can do such an instant battery state estimation.

Figure 15A:
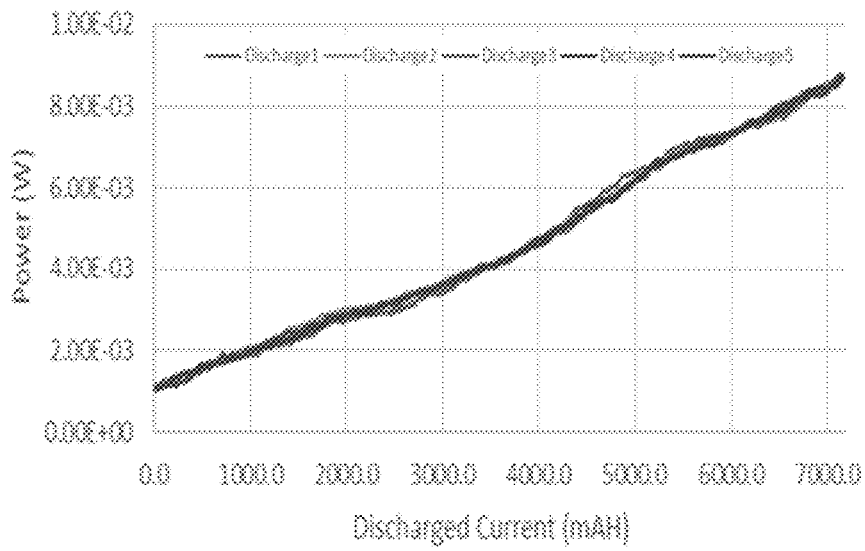
FIGS. 15A-C illustrates example measured average power, coil resistance, and coil inductance of the inductive coil after compensating the effect of battery current.
Figure 15B:
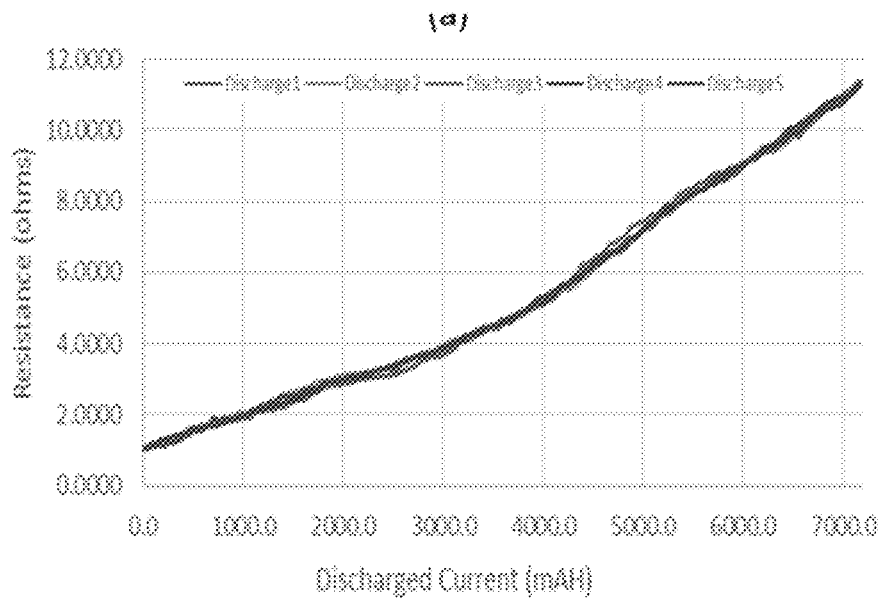
Figure 15C:
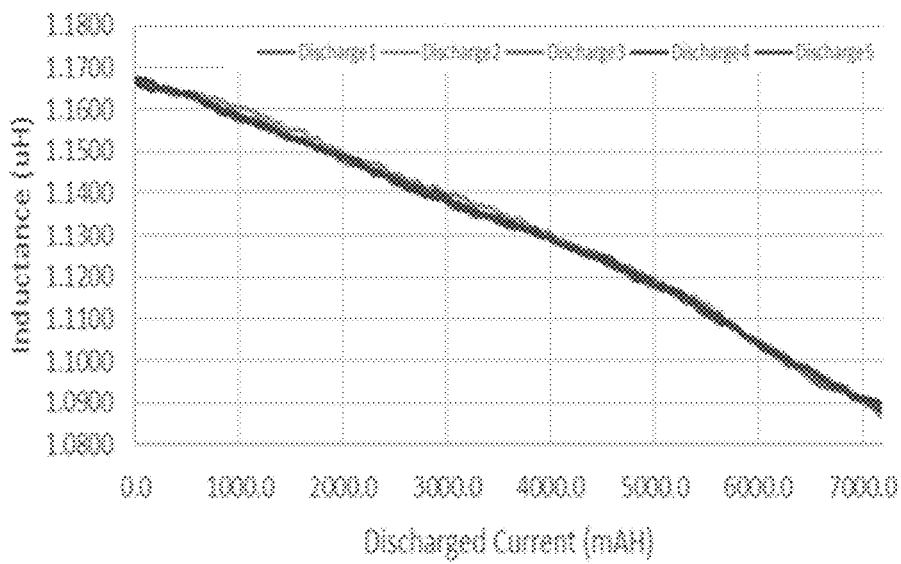

FIG. 15A-C illustrates the measured and calculated average power (real part of the complex power), resistance, and inductance after compensating the effect of battery currents. The measurement results show a clear correlation between the battery state of charge (SoC) and the measured data after excluding the effect of battery current. Five repeated measurements provided consistent results.

Figure 16A:
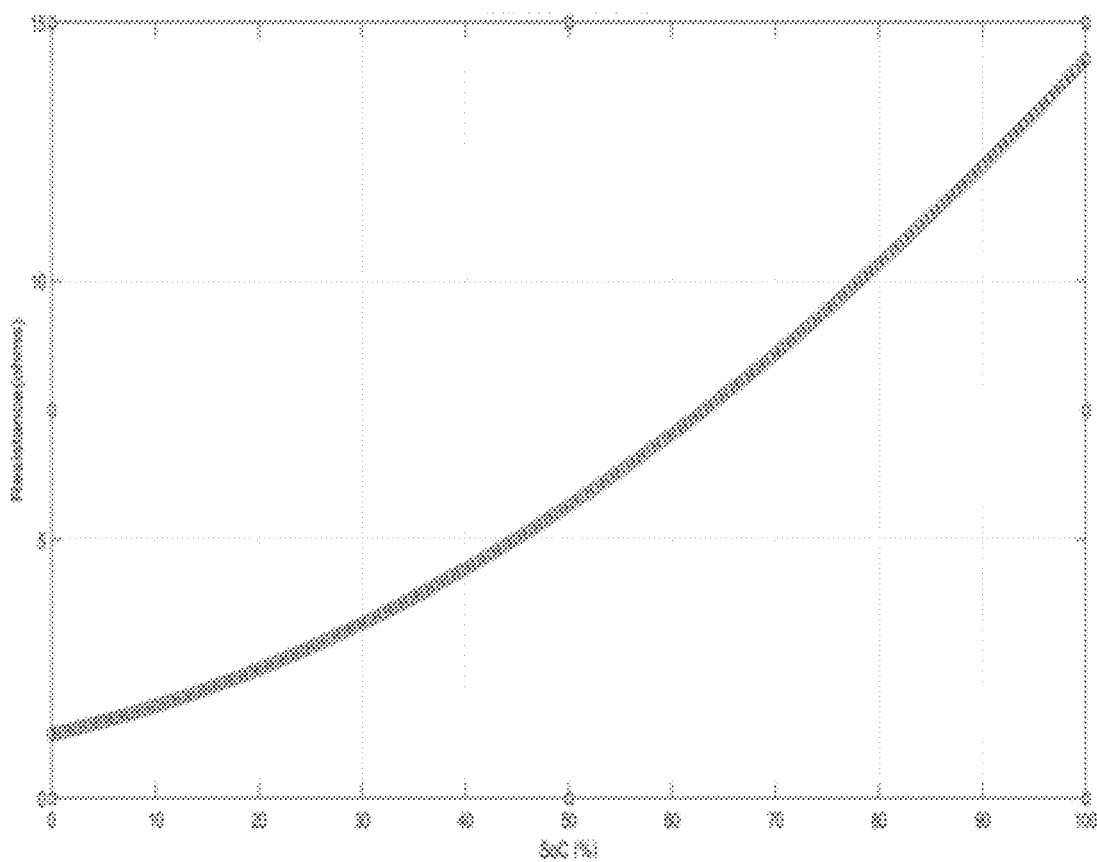
FIG. 16A-B illustrates an example relation between measured coil resistance and inductance with estimated battery SoC.
Figure 16B:
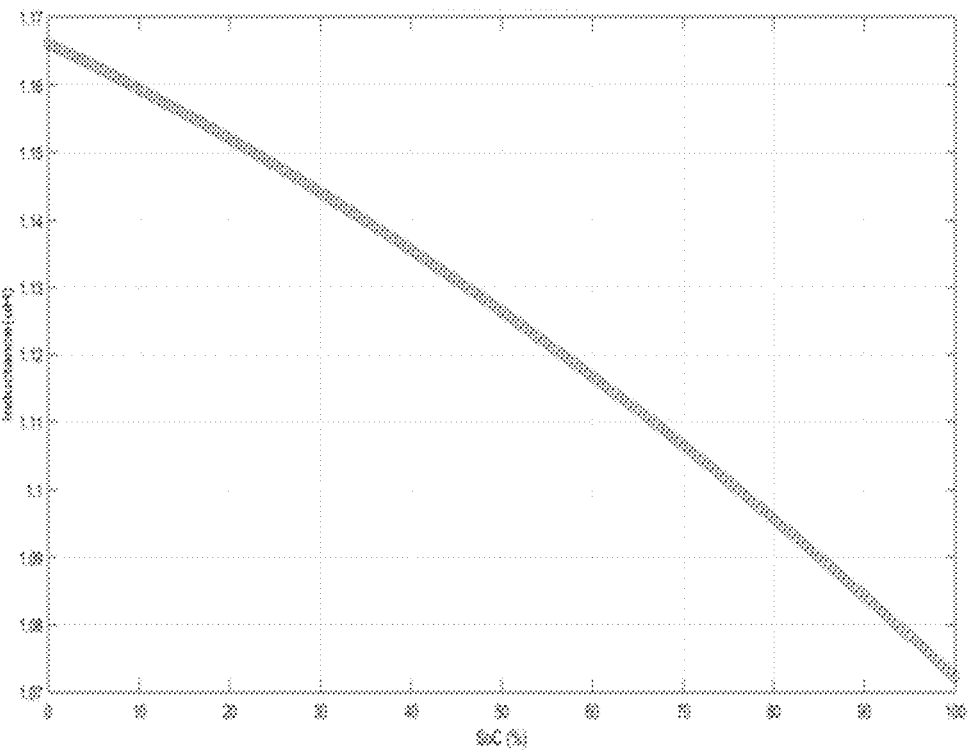

FIG. 16A-B illustrates the relation between the estimated battery SoC and the measured inductive coil inductance and resistance. The implemented exemplary system conducts the measurement 8 times per second. The plots in FIG. 15A-C used the raw measurement data, and the SoC estimation shown FIG. 16-A-B used the moving average to filter out the measurement noise.

The system can optionally use a mixer to down-convert the signal frequency to a lower frequency. Because Eddy current loss increases with increasing frequency, using a high-frequency excitation signal, preferably higher than 5 MHz, is beneficial for inductive coil-based battery electrochemical state measurement. The example embodiment used 18.7 MHz. To convert an analog signal into digital, the system may include a high-speed analog-to-digital converter (ADC). However, such a component is expensive and power-intensive. The issue can be mitigated by down-converting the frequency to a lower frequency using a mixer.

Figure 17A:
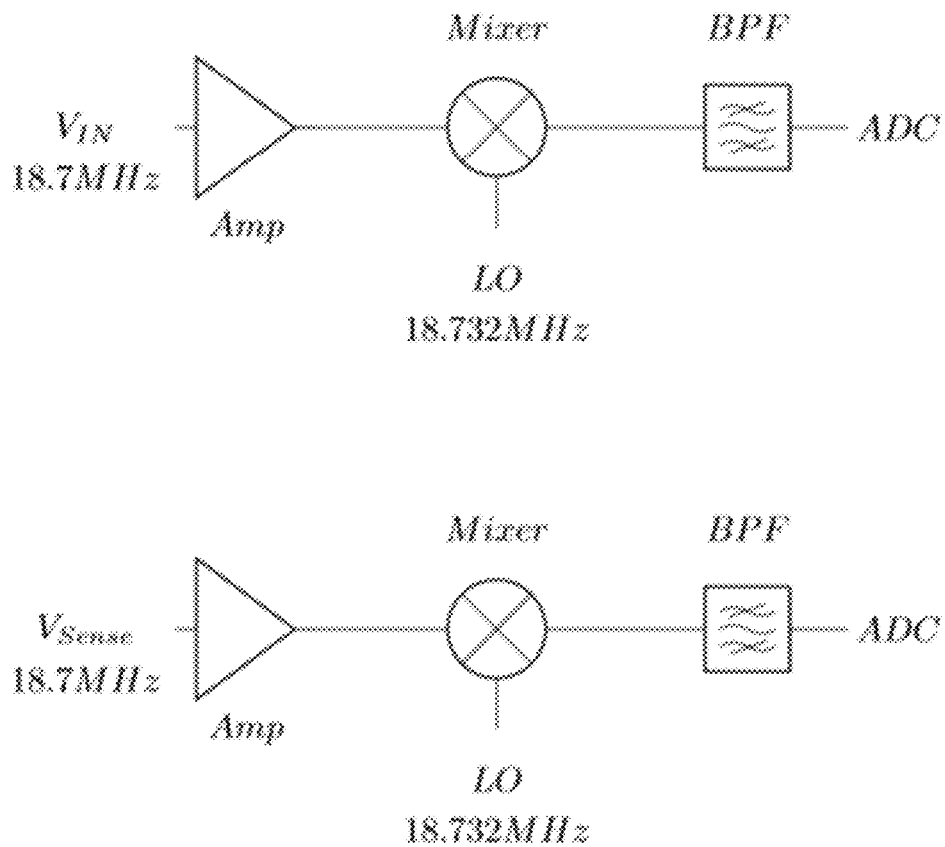
FIGS. 17A-B illustrates an example block diagram (A) and circuit level implementation example (B) of an inductive coil sensing circuit utilizing a mixer for frequency down conversion with a block diagram.
Figure 17B:
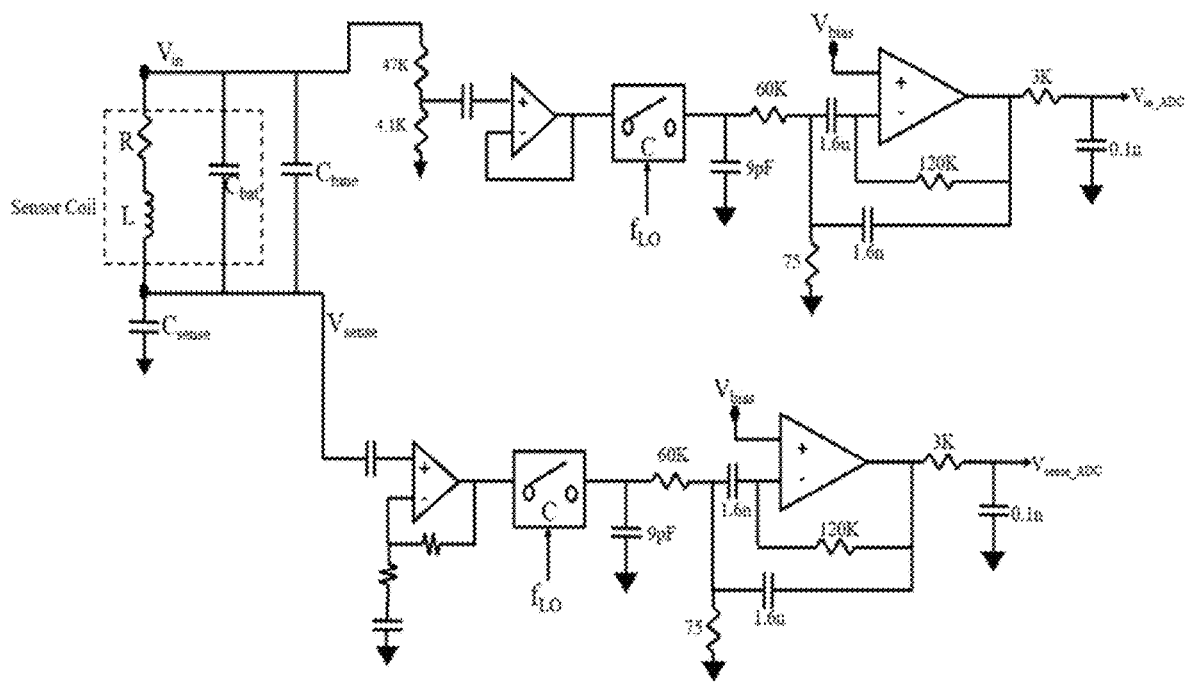

FIG. 17A-B, illustrates an example of a dual-output phase-locked loop (PLL) which generates 18.7 MHz and 18.732 MHz (LO) signals. The 18.7 MHz signal is used to excite the inductive coil, and the 18.732 MHz signal is used for a mixer that down-converts the 18.7 MHz signal to 32 kHz. An active or passive bandpass filter centered at 32 kHz passes only the 32 kHz down-converted signal, and the following ADC samples the 32 kHz signal. A digital processor calculates the amplitude and phase of the 32 kHz signal first and uses the amplitude and phase to calculate the amplitude and phase of the original 18.7 MHz signal.

Figure 18:
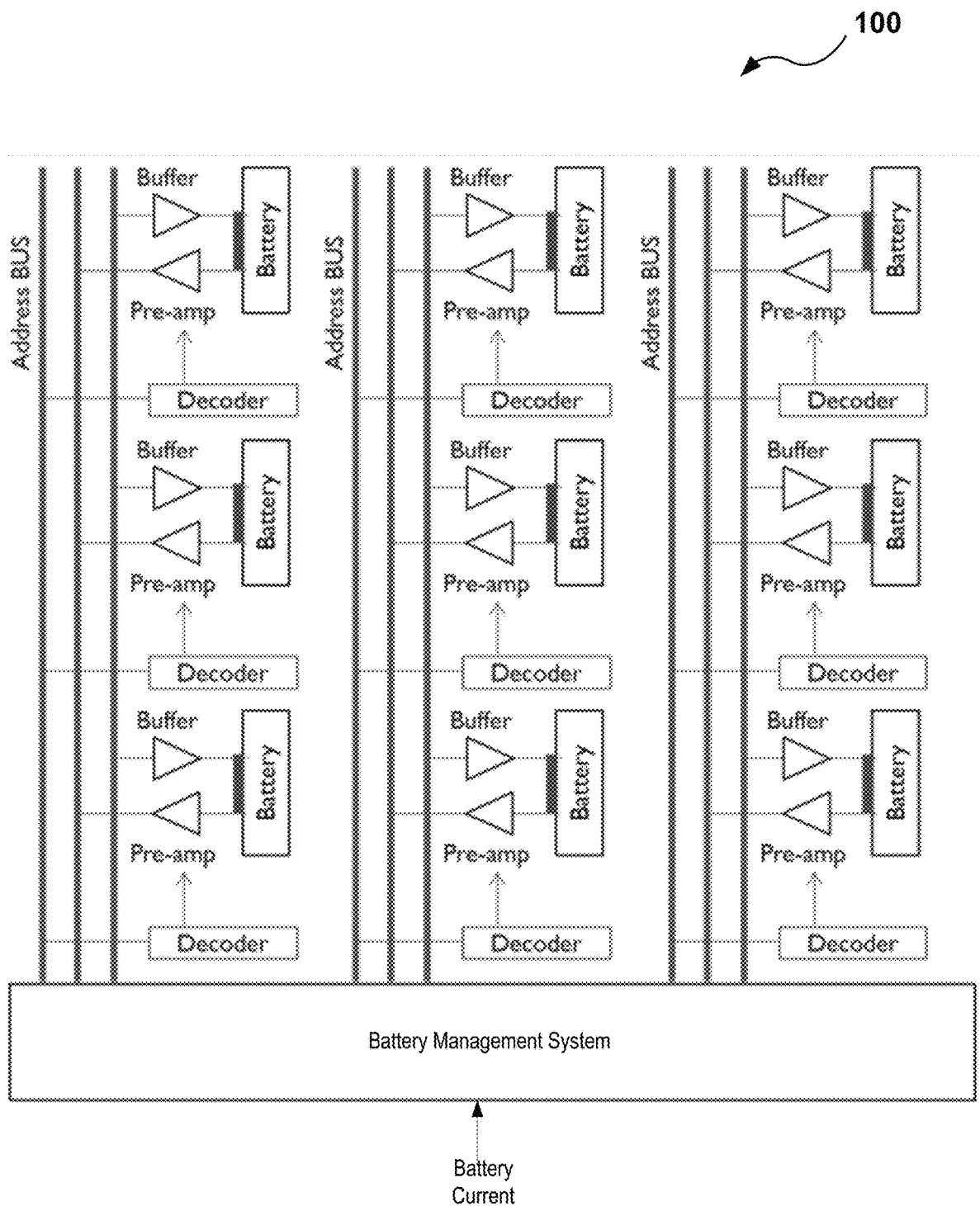
FIG. 18 illustrates an example of the system where multiple inductive coils share the same coil drive and sensor interface circuits.

FIG. 18 illustrates a second example of the system with a battery management system 1802. One or more may be coils connected to the battery management system. The battery management system may include the coil driver and sensor interface, controller, and/or the battery discharge unit, which are described in reference to FIG. 12. The battery management system may cause excitation of one or more coils, sequentially or simultaneously. Alternatively, or in addition, the battery diagnostic circuitry may receive battery current from one or more current sensors. The current sensor(s) are not shown in FIG. 18 for simplicity.

In additional or alternative aspects, the system may use a combination of the inductive coil-based battery electrochemical state estimation and ampere hour counting (AHC) based battery electrochemical state estimation. The inductive coil-based sensing method can estimate battery electrochemical states such as SoC almost instantly and its estimation error does not accumulate over time. One potential issue of the inductive coil-based method is its relatively high-power consumption. To generate a strong enough magnetic field, enough amount of current must be pumped into the coil. The stronger the magnetic field the stronger the signal-to-noise ratio. Because of the need for a high coil current, the sensing module consumes much more power than typical voltage, current, and temperature sensors that are commonly used for battery management. The high-power consumption issue can be serious for systems that use a large number of batteries such as electric vehicles (EV) and energy storage systems (ESS). The system addresses the issue by using both inductive coil-based and AHC-based methods in a complementary manner. For battery SoC estimation, the system conducts the inductive coil-based SoC estimation sporadically or periodically and uses AHC-based SoC estimation between the intervals. AHC-based battery SoC measurement method provides a fairly accurate estimation of the changes in SoC (DSoC) over a short period of time. However, it does not provide absolute SoC value, and its estimation error increases over time because of its integrating nature. For the reasons, the AHC-based SoC estimation result must be calibrated often before the accumulated error becomes too big.

Figure 19A:
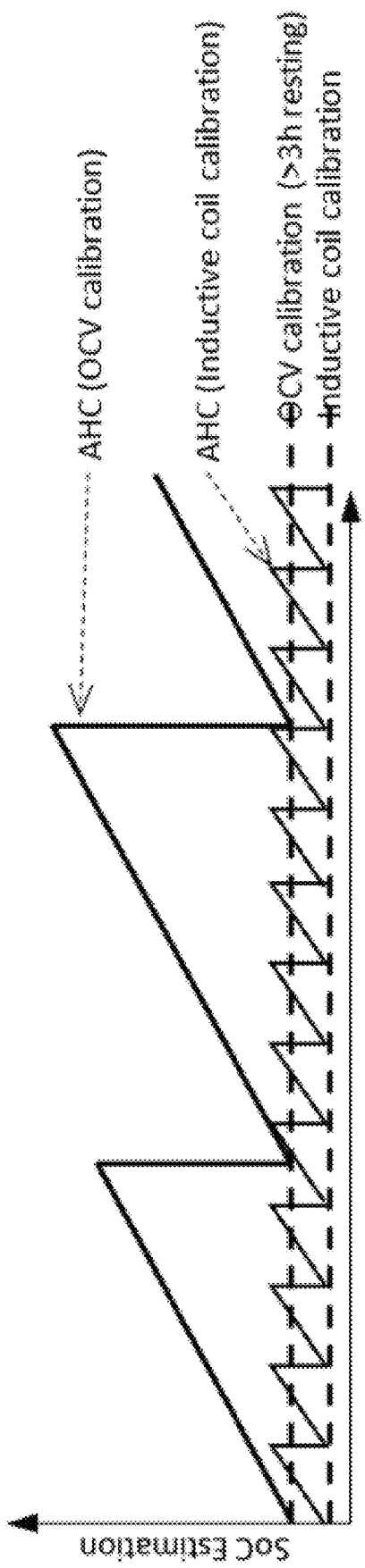
FIG. 19 illustrates an example of a SoC estimation error of a system utilizing both inductive coil-based and AHC-based SoC estimation where (A) illustrates periodic calibration utilizing inductive coil-based estimation, where (B) illustrates non-periodic calibration utilizing inductive coil-based estimation.
Figure 19B:
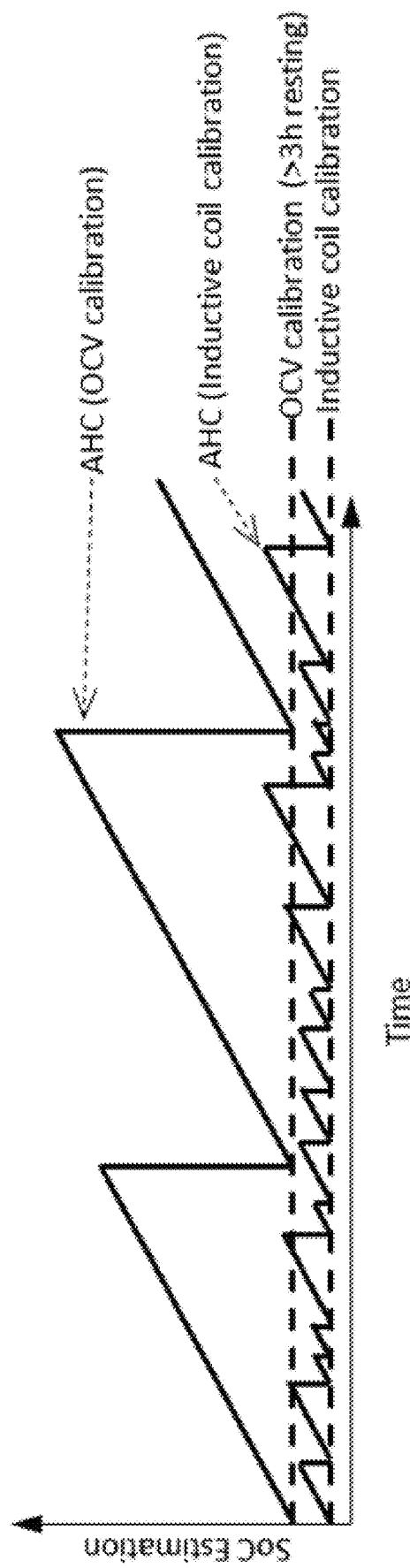

FIG. 19A-B illustrates using OCV-based SoC estimation for calibrations. Because OCV-based SoC estimation requires a long resting, typically more than 3 hours, at zero current condition, performing the calibration often is challenging for many practical applications. For example, for EVs, the calibration can be performed during overnight parking, but the SoC estimation error can grow to an unacceptable level during long driving. For ESS, a zero-current condition for more than 3 hours required for OCV-based SoC estimation rarely happens. The system may apply inductive coil-based SoC estimation periodically or sporadically for the calibration. For example, performing the inductive coil-based SoC estimation and calibration once per hour will mitigate the power consumption issue of the inductive coil-based method, and keep the SoC estimation error of the AHC-based method well within the acceptable range, as depicted in FIG. 19A. The system can also perform the inductive coil-based SoC estimation and calibration irregularly based on pre-defined calibration criterion, as shown in FIG. 19B. For example, the system can perform the inductive coil-based SoC estimation and calibration when the accumulated battery current since the last calibration reaches a pre-defined value. Alternatively or in addition, the system can perform the inductive coil-based SoC estimation and calibration when the battery current sensor reports a small current, smaller than a pre-defined value, so it can eliminate the need for compensating the effect of battery current. The system can define the criterion based on elapsed time, integrated battery current value, instantaneous battery current value, temperature, battery terminal voltage, and target accuracy. In another implementation, when the system determines to perform the calibration utilizing inductive coil-based SoC estimation, the system can momentarily turn off the battery current, both charging and discharging currents, while performing the measurement. This will reduce the amount of computation required for SoC estimation by eliminating or minimizing the computation for battery current compensation.

Figure 20:
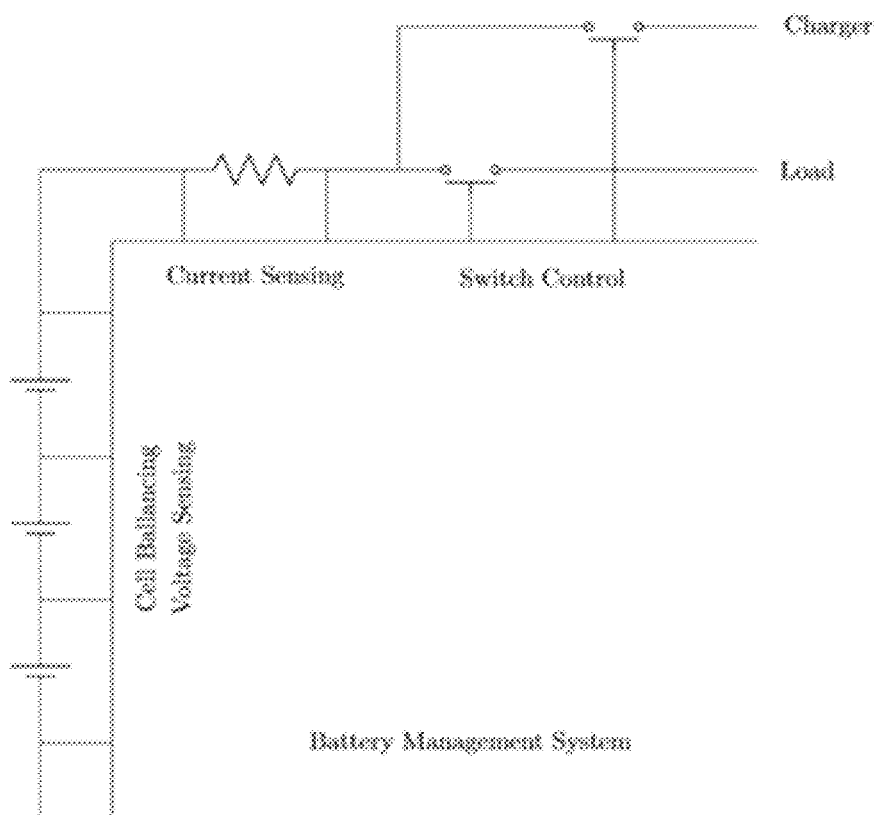
FIG. 20 illustrates an example block diagram of a battery management system (BMS).

FIG. 20 illustrates an example of charging and discharging paths. The system may include a charging switch and a discharging switch. Battery current can be turned off by turning off the charging and discharging path switches. Even when the switches are off, the battery management system (BMS) may draw a small amount of current from the battery. But, because the current is small and changes in a very small range, compensating its effect is much easier or not required. In an exemplary system built for testing performs, the whole sensing and computation within 125 msec, so the required current cut off time can be very short.

Figure 21:
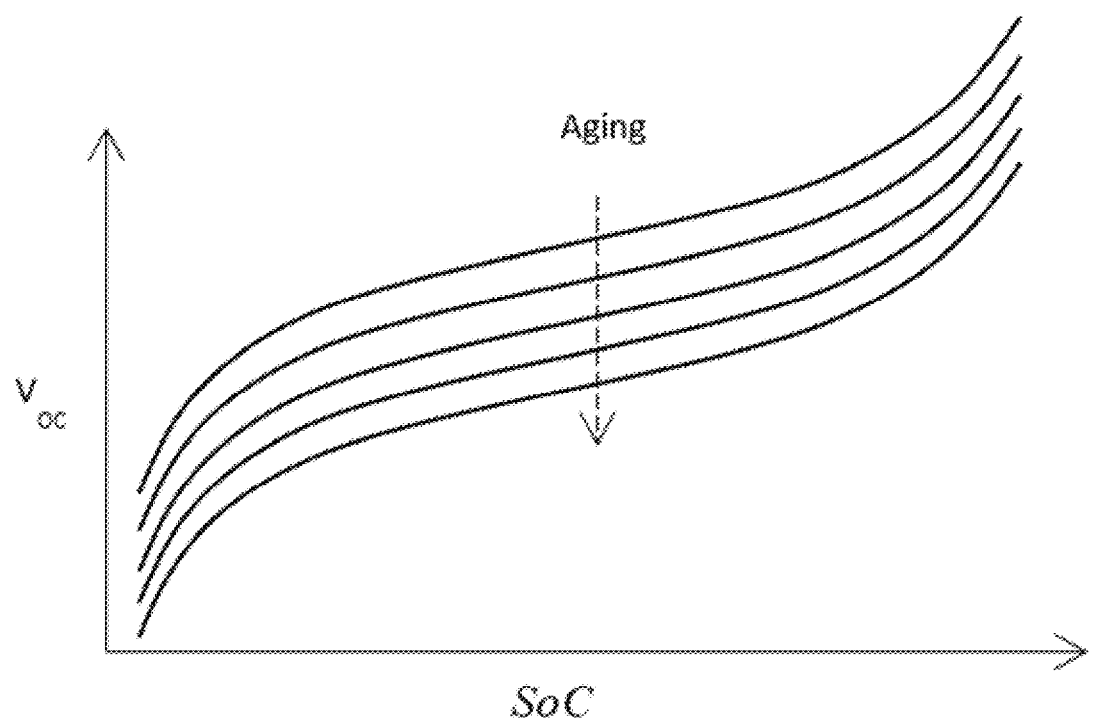
FIG. 21 illustrates an example of changes in SoC vs VOC curves with battery aging.
Figure 22:
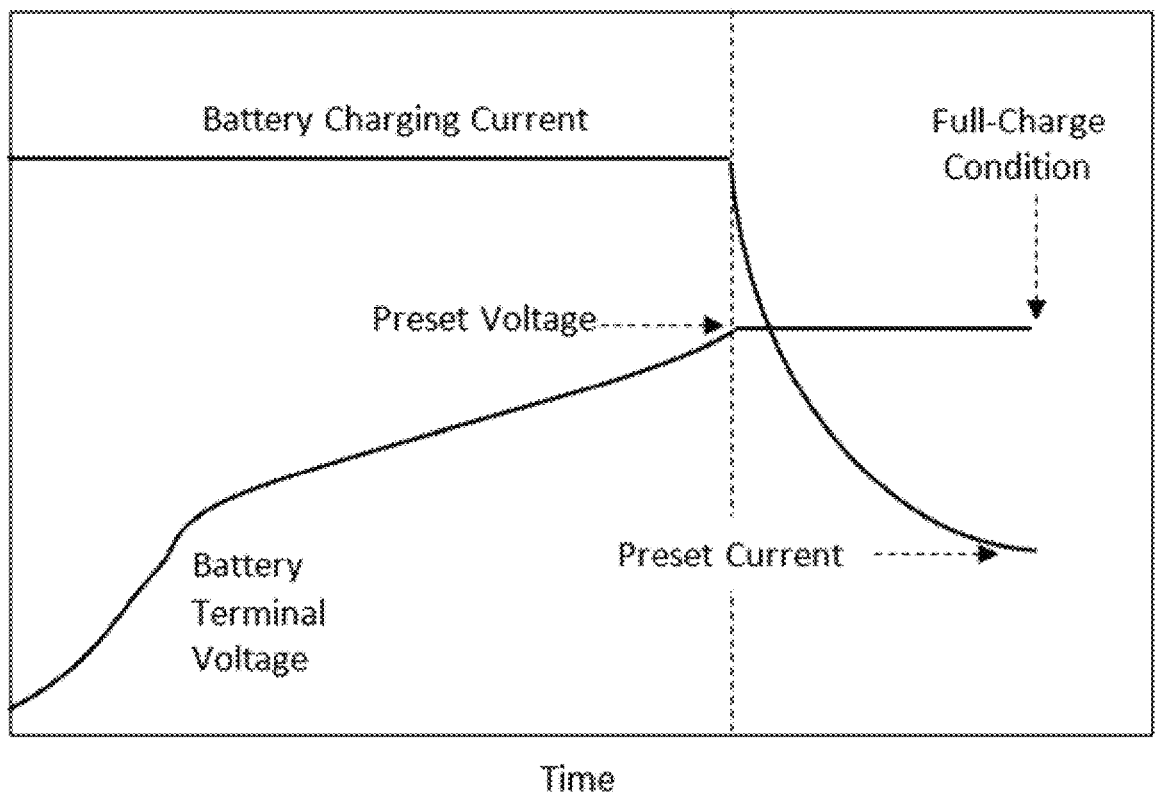
FIG. 22 illustrates an example of an EV charging sequence-constant current and constant voltage (CCCV).

In yet other aspects, the system may combine the inductive coil-based battery state estimation method with other battery state estimation methods such as internal resistance measurement and open circuit voltage measurement to improve SoH estimation accuracy. For example, battery internal resistance can be relatively easily measured and is a function of battery SoC, SoH, and temperature. Compensating the effect of temperature is relatively easy but separating the contributions from SoC and SoH is not trivial. Because it depends on both battery SoC and SoH, the system needs to know SoC to accurately estimate SoH. The system can use the SoC measured using the inductive coil-based method and use it to estimate SoH. Another example is combining inductive-coil-based measurement and OCV measurement. Unlike SoC, SoH measurement does not need to be continuous or frequent. Battery OCV can be measured after long, typically more than 3 hours, resting such as overnight parking of electric vehicles. The relation between OCV and SoC changes over battery aging, as depicted in FIG. 21, and the system can estimate the degree of battery aging, SoH, using measured OCV if SoC is known. The system can use inductive coil-based SoC measurement data and OCV measurement data to estimate SoH. Another way of estimating SoH, for the batteries in EVs, is by using the inductive coil-based SoC measurement value at the full-charge condition. EV battery charging typically uses CCCV (constant current and constant voltage) method as depicted in FIG. 22. EV battery charging initially uses a constant current, and, once the battery terminal voltage reaches a preset value, the charging changes to a constant voltage mode. Battery charging is completed when the charging current drops down to a present value, and the battery reaches the full-charge condition. With battery aging, battery SoC at a full-charge condition degrades. The system can estimate battery SoH by measuring SoC at the full-charge condition.

The system may be implemented with additional, different, or fewer components than illustrated. Each component may include additional, different, or fewer components.

Figure 23:
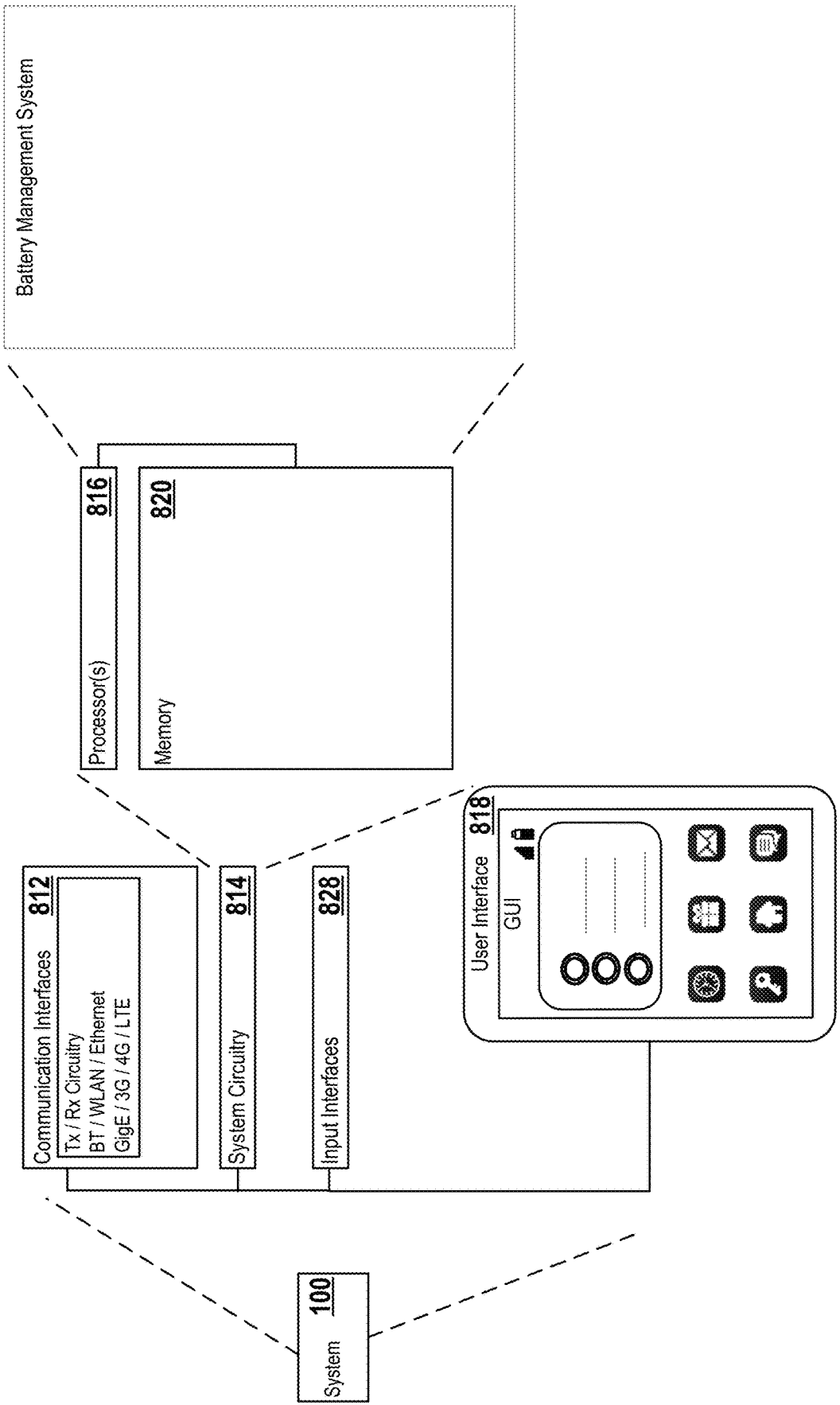
FIG. 23 illustrates another example of a system with a processor and memory.

FIG. 23 illustrates another example of the system 100. The system 100 may include communication interfaces 812, input interfaces 828 and/or system circuitry 814. The system circuitry 814 may include a processor 816 or multiple processors. Alternatively or in addition, the system circuitry 814 may include memory 820.

The processor 816 may be in communication with the memory 820. In some examples, the processor 816 may also be in communication with additional elements, such as the communication interfaces 812, the input interfaces 828, and/or the user interface 818. Examples of the processor 816 may include a general processor, a central processing unit, logical CPUs/arrays, a microcontroller, a server, an application specific integrated circuit (ASIC), a digital signal processor, a field programmable gate array (FPGA), and/or a digital circuit, analog circuit, or some combination thereof.

The processor 816 may be one or more devices operable to execute logic. The logic may include computer executable instructions or computer code stored in the memory 820 or in other memory that when executed by the processor 816, cause the processor 816 to perform the operations the system and methods described herein. The computer code may include instructions executable with the processor 816.

The memory 820 may be any device for storing and retrieving data or any combination thereof. The memory 820 may include non-volatile and/or volatile memory, such as a random access memory (RAM), a read-only memory (ROM), an erasable programmable read-only memory (EPROM), or flash memory. Alternatively or in addition, the memory 820 may include an optical, magnetic (hard-drive), solid-state drive or any other form of data storage device. The memory 820 may include the system 100 and/or any other component or sub-component of the system 100 described herein.

The user interface 818 may include any interface for displaying graphical information. The system circuitry 814 and/or the communications interface(s) 812 may communicate signals or commands to the user interface 818 that cause the user interface to display graphical information. Alternatively or in addition, the user interface 818 may be remote to the system 100 and the system circuitry 814 and/or communication interface(s) may communicate instructions, such as HTML, to the user interface to cause the user interface to display, compile, and/or render information content. In some examples, the content displayed by the user interface 818 may be interactive or responsive to user input. For example, the user interface 818 may communicate signals, messages, and/or information back to the communications interface 812 or system circuitry 814.

The system 100 may be implemented in many ways. In some examples, the system 100 may be implemented with one or more logical components. For example, the logical components of the system 100 may be hardware or a combination of hardware and software. The logical components may include the system or any component or subcomponent of the system 100. In some examples, each logic component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each component may include memory hardware, such as a portion of the memory 820, for example, that comprises instructions executable with the processor 816 or other processor to implement one or more of the features of the logical components. When any one of the logical components includes the portion of the memory that comprises instructions executable with the processor 816, the component may or may not include the processor 816. In some examples, each logical component may just be the portion of the memory 820 or other physical memory that comprises instructions executable with the processor 816, or other processor(s), to implement the features of the corresponding component without the component including any other hardware. Because each component includes at least some hardware even when the included hardware comprises software, each component may be interchangeably referred to as a hardware component.

Some features are shown stored in a computer readable storage medium (for example, as logic implemented as computer executable instructions or as data structures in memory). All or part of the system and its logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL).

All of the discussion, regardless of the particular implementation described, is illustrative in nature, rather than limiting. For example, although selected aspects, features, or components of the implementations are depicted as being stored in memory(s), all or part of the system or systems may be stored on, distributed across, or read from other computer readable storage media, for example, secondary storage devices such as hard disks, flash memory drives, floppy disks, and CD-ROMs. Moreover, the various logical units, circuitry and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one example, the instructions are stored on a removable media device for reading by local or remote systems. In other examples, the logic or instructions are stored in a remote location for transfer through a computer network or over telephone lines. In yet other examples, the logic or instructions are stored within a given computer and/or central processing unit ("CPU").

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same apparatus executing a same program or different programs. The components may be resident on separate hardware, such as separate removable circuit boards, or share common hardware, such as a same memory and processor for implementing instructions from the memory. Programs may be parts of a single program, separate programs, or distributed across several memories and processors.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A method, comprising:
    exciting an inductive coil attached to the rechargeable battery with an AC signal to generate magnetic fields;
    measuring a battery current with a current sensor;
    measuring complex power, power factor, complex impedance, inductance, resistance of the inductive coil, or a combination thereof;
    calculating an electrochemical state of the battery based on the battery current, complex power, the power factor, the complex impedance, the inductance, the resistance, or the combination thereof; and
    outputting the electrochemical state,
    wherein a high magnetic permeability sheet covers the inductive coil, and another high magnetic permeability sheet is placed on the opposite side of the battery.

2. The method of claim 1 wherein the electrochemical state is a state of charge of the battery, a state of health of the battery, or a combination thereof.

3. The method of claim 1, further comprising:
determining whether a calibration trigger criterion has been satisfied;
in response to satisfaction of the calibration criterion:
exciting the inductive coil and an electrochemical state of the battery based on the battery current, and
calculating an electrochemical state of the battery based complex power, the power factor, the complex impedance, the inductance, the resistance, or the combination thereof.

4. The method of claim 1, further comprising:
exciting a plurality of inductive coils respectively attached to a plurality of rechargeable batteries.

5. The method of claim 4, wherein the inductive coils are excited sequentially.

6. The method of claim 4, wherein the inductive coils are excited simultaneously.

7. The method of claim 4, wherein the batteries are connected in series and the same current sensor measures the battery current for all of the batteries.

8. The method of claim 4, wherein the electrochemical state is the average electrochemical state of all of the batteries.

9. The method of claim 1, wherein the battery is a prismatic or pouch Li ion battery.

10. The method of claim 1, wherein a tuning capacitor is connected to the inductive coil in series the method further comprising:
measuring a voltage across the tuning capacitor; and
calculating the complex power, power factor, complex impedance, inductance and/or resistance of the coil based on the measured voltage of the tuning capacitor.

11. The method of claim 1, wherein a tuning capacitor is connected to the inductive coil in parallel, a sensing element, a resistor or a capacitor, is connected in series, the method further comprising:
measuring a voltage across the sensing element; and
calculating, based on the measured voltage across the sensing element, the complex power, power factor, complex impedance, inductance and/or resistance of the coil.

12. The method of claim 1, further comprising:
down converting, with a mixer, the AC signal frequency to a lower frequency.

13. The method of claim 1, wherein a high magnetic permeability sheet covers the inductive coil.

14. The method of claim 1, wherein outputting the electrochemical state comprises:
storing the electrochemical state in a memory, transmitting the electrochemical state over a network, displaying the electrochemical, or a combination thereof.

15. A method, comprising:
exciting an inductive coil attached to the rechargeable battery with an AC signal to generate magnetic fields;
measuring a battery current with a current sensor;
measuring complex power, power factor, complex impedance, inductance, resistance of the inductive coil, or a combination thereof;
calculating an electrochemical state of the battery based on the battery current, complex power, the power factor, the complex impedance, the inductance, the resistance, or the combination thereof; and
outputting the electrochemical state,
wherein the AC excitation signal frequency is in the range of 5 MHz to 50 MHz.

16. The method of claim 15, wherein a high magnetic permeability sheet covers the inductive coil, and another high magnetic permeability sheet is placed on the opposite side of the battery.

17. A method comprising:
tracking a battery state of charge value by:
receiving a battery current measurement based on a signal generated by a current sensor,
integrating the battery current measurement over a time period;
determining a change in the state of charge based on the integrated current measurement, and
adjusting a battery state of charge value based on the change in battery state of charge;
repeatedly calibrating the battery state of charge value by:
exciting an inductive coil attached to the rechargeable battery with an AC signal to generate magnetic fields,
measuring the battery current with the current sensor,
measuring complex power, power factor, complex impedance, inductance, resistance of the inductive coil, or a combination thereof,
updating the battery state of charge value based on the battery current and at least one of the complex power, the power factor, the complex impedance, inductance, or the resistance of the inductive coil,
outputting the battery state of charge value.

18. The method of claim 17 wherein the rechargeable battery is configured to charge via a charging path and discharge via a discharge path, wherein calibrating the battery state of charge value further comprises:
opening the charging path and the discharging path during the inductive coil excitation to compensate for the battery current.

19. The method of claim 17, further comprising:
measuring a value comprising elapsed time since a previous calibration, instantaneous battery current value, the integrated battery current value, battery temperature, and/or battery terminal voltage, or a combination thereof; and
determining a measured value satisfies a calibration trigger criterion, wherein the calibration is performed in response to satisfaction of the calibration trigger criterion.

20. The method of claim 19, wherein the calibration trigger criterion comprises a condition that the battery is rested for a predetermined time where current is less than or equal to a current threshold value, a condition that the battery is fully charged, or a combination thereof.

21. A method, comprising:
measuring battery current based on output of a current sensor connected to at least one terminal of a battery;
measuring state of charge of the battery by:
exciting an inductive coil attached to the battery with an AC signal to generate magnetic fields,
measuring battery current from a current sensor,
measuring complex power, power factor, complex impedance, inductance, resistance of the coil, or a combination thereof, and
determining the battery state of charge based on the measured battery current and the complex power, power factor, complex impedance, inductance, internal resistance, or a combination thereof; and
outputting the state of charge of the battery, a state of health of the battery, or a combination thereof.

22. The method of claim 21, further comprising:
measuring battery internal resistance based on the battery current; and
determining the battery state of health based on the internal resistance and the state of charge value.

23. The method of claim 21, further comprising:
measuring an open circuit voltage of the battery; and
determining the battery state of health based on the open circuit voltage and the state of charge values.

* * * * *